United States Patent [19]

Forouhi et al.

[11] Patent Number: 5,272,101
[45] Date of Patent: Dec. 21, 1993

[54] ELECTRICALLY PROGRAMMABLE ANTIFUSE AND FABRICATION PROCESSES

[75] Inventors: Abdul R. Forouhi, San Jose; Esmat Z. Hamdy, Fremont; Chenming Hu, Alamo; John L. McCollum, Saratoga, all of Calif.

[73] Assignee: Actel Corporation, Sunnyvale, Calif.

[21] Appl. No.: 743,261

[22] Filed: Aug. 9, 1991

Related U.S. Application Data

[63] Continuation-in-part of Ser. No. 604,779, Oct. 26, 1990, Pat. No. 5,181,096, which is a continuation-in-part of Ser. No. 508,306, Apr. 12, 1990, Pat. No. 5,070,384.

[51] Int. Cl.⁵ .................... H01L 21/44; H01L 21/265
[52] U.S. Cl. ........................... 437/50; 437/52; 437/192; 437/922
[58] Field of Search .............. 437/922, 48, 49, 50, 437/51, 52; 357/23.6, 51; 365/100, 104, 105, 102, 96; 257/229, 230

[56] References Cited

U.S. PATENT DOCUMENTS

| | | | |
|---|---|---|---|
| 4,569,120 | 2/1986 | Stacy et al. | 365/105 |
| 4,569,121 | 2/1986 | Lim et al. | 365/105 |
| 4,651,409 | 3/1987 | Ellsworth et al. | 365/104 |
| 4,748,490 | 5/1988 | Hollingsworth | 357/51 |
| 4,881,114 | 11/1989 | Mohsen et al. | 365/105 |
| 5,010,039 | 4/1991 | Ku et al. | 437/228 |
| 5,021,849 | 6/1991 | Pfiester et al. | 365/175 |
| 5,059,555 | 10/1991 | Iranmanesh et al. | 437/200 |
| 5,070,384 | 12/1991 | McCollum et al. | 357/51 |

FOREIGN PATENT DOCUMENTS 2-208962 8/1990 Japan .................... 365/103

Primary Examiner—Robert Kunemund
Assistant Examiner—Loc Q. Trinh
Attorney, Agent, or Firm—Kenneth D'Alessandro

[57] ABSTRACT

A process for fabricating a metal-to-metal antifuse in a process sequence for forming a double layer metal interconnect structure includes the steps of forming and defining a first metal interconnect layer, forming and planarizing an inter-metal dielectric layer, forming an antifuse cell opening in the inter-metal dielectric layer, forming and defining an antifuse layer, forming metal-to-metal via holes in the inter-metal dielectric layer, and forming and defining a second metal interconnect layer.

7 Claims, 11 Drawing Sheets

PRIOR ART

ELECTRICALLY PROGRAMMABLE ANTIFUSE AND FABRICATION PROCESSES

RELATED APPLICATIONS

The present application is a continuation-in-part of prior co-pending application Ser. No. 07/604,779, filed Oct. 26, 1990, now U.S. Pat. No. 5,181,096 which is expressly incorporated herein by reference and which is a continuation-in-part of co-pending U.S. patent application Ser. No. 07/508,306, filed Apr. 12, 1990, now U.S. Pat. No. 5,070,384.

BACKGROUND OF THE INVENTION

1. Field Of The Invention

This invention relates to integrated electronic circuit interconnect technology. More particularly, this invention relates to electrically-programmable antifuse elements positioned between two conductive interconnect layers in a programmable interconnect architecture and to processes for fabricating them.

2. The Prior Art

Integrated electronic circuits are usually fabricated with all internal connections set during the manufacturing process. However, because of high development costs and high manufacturing tooling costs of such circuits, circuits have been developed which can be configured or programmed by the user for a specific application by implementing user-programmable interconnect elements. Such circuits are called programmable circuits and may be programmed by using a plurality of programmable interconnect elements which may be either selectively open circuited or short circuited by the end user to create or break circuit connections.

Programmable interconnect elements are programmable electrical interconnect devices which are supplied as connections which may be selectively broken or supplied as open circuits which may be selectively shorted at selected electronic nodes in the circuit by the user after the integrated circuit device has been fabricated, packaged, and supplied to the user. Such programming is undertaken in order to deactivate or activate, respectively, the selected electronic nodes such that the circuit can be programmed to perform a desired function.

Antifuse programmable interconnect elements, supplied as initially open-circuit elements which may be selectively short circuited by programming, have been utilized for customization of integrated circuits such as field programmable gate array integrated circuits. Examples of antifuse structures have been described in the prior art, such as in U.S. Pat. Nos. 4,823,181 and 4,899,205, and in co-pending U.S. patent applications Ser. Nos. 07/508,303 now U.S. Pat. No. 5,050,745 and 07/508,306 07/604,779, now U.S. Pat. No. 5,181,096.

Methods for fabricating antifuses associated with metal layers in a semiconductor structure are known. Antifuses for selectively making connections between regions in a semiconductor substrate and conductive layers disposed above the substrate have been described, for example, in U.S. Pat. Nos. 4,442,507, 4,590,589, 4,424,579, and 4,598,386.

European Patent Application Number 90309731.9, Publication Number 0 416 903 A2 discloses a basic process for forming a metal-to-metal antifuse employing an amorphous silicon antifuse material in which antifuse cell openings are formed simultaneously with the formation of inter-metal vias. The antifuse formed by this process is susceptible to several problems as a result of the fabrication process used to manufacture it. A similar process is described in U.S. Pat. No. 4,458,297, directed to a user-programmable interconnect wiring scheme for hybrid integrated circuit assemblies.

In addition, U.S. Pat. No. 4,914,055 describes a process for fabricating an antifuse associated with an extra metal layer in a double-metal interconnect process. This patent teaches locating the antifuse between the extra metal layer and the first level interconnect rather than between the two levels of interconnect. The process described by this patent requires seven separate photolithographic masking steps to define the antifuse structure.

It would be desirable to develop processes for fabricating a metal-to-metal antifuse which employ a minimum number of masking steps and/or which avoid the problems inherent in the prior art metal-to-metal antifuse fabrication processes.

It is therefore a object of the present invention to develop a process for fabricating a metal-to-metal antifuse which is compatible with a wider variety of via plug technologies.

It is another object of the present invention to develop a process for fabricating a metal-to-metal antifuse which avoids stressing the antifuse material layer around the periphery of the antifuse cell opening.

Yet another object of the present invention is to develop a process for fabricating a metal-to-metal antifuse which produces an antifuse having better controlled breakdown characteristics.

A further object of the present invention is to develop a process for fabricating a metal-to-metal antifuse which is compatible with sputter-deposited antifuse material layer materials.

Another object of the present invention is to develop a process for fabricating a metal-to-metal antifuse which is less susceptible to problems caused by backsputtering steps performed prior to deposition of second layer metal.

An additional object of the present invention is to develop a metal-to-metal antifuse which may be fabricated using a minimum number of photolithography steps.

Yet another object of the present invention is to provide a metal-to-metal antifuse which is located between the two levels of metal normally used for interconnect in a double metal process, or between the second and third levels of metal normally used for interconnect in a triple metal process.

Finally, another object of the present invention is to provide a metal-to-metal antifuse having reduced capacitance whose size is limited by the minimum widths of the two levels of metal interconnect between which it is disposed.

These, and other objects of the present invention will become apparent from the disclosure, drawings, and claims herein.

BRIEF DESCRIPTION OF THE INVENTION

According to a first aspect of the present invention, a process for fabricating a metal-to-metal antifuse in a process sequence for forming a double layer metal interconnect structure includes the steps of forming and defining a first metal interconnect layer including portions to serve as the lower electrodes for one or more antifuses, forming and planarizing an inter-metal dielectric layer, forming an antifuse cell opening in the inter-metal dielectric layer, forming and defining an antifuse layer, forming metal-to-metal via holes in the inter-metal dielectric layer, and forming and defining a second metal interconnect layer.

According to a second aspect of the present invention, a process for fabricating a metal-to-metal antifuse in a process sequence for forming a double layer metal interconnect structure includes the steps of forming and defining a first metal interconnect layer including portions to serve as the lower electrodes for one or more antifuses, forming an antifuse layer and a barrier capping layer over the first metal interconnect layer, defining the antifuse layer and the barrier/capping layer, forming and planarizing an inter-metal dielectric layer, simultaneously forming an antifuse cell opening and metal-to-metal via holes in the inter-metal dielectric layer, forming and defining an antifuse layer, and forming and defining a second metal interconnect layer.

According to a third aspect of the present invention, a process for fabricating a metal-to-metal antifuse in a process sequence for forming a double layer metal interconnect structure includes the steps of forming and defining a first metal interconnect layer including portions to serve as the lower electrodes for one or more antifuses, forming and planarizing an inter-metal dielectric layer, simultaneously forming an antifuse cell opening and metal-to-metal via holes in the inter-metal dielectric layer, forming an antifuse layer, forming a barrier/capping layer, defining the barrier capping layer and the antifuse layer, and forming and defining a second metal interconnect layer.

According to a fourth aspect of the present invention, a process for fabricating a metal-to-metal antifuse in a process sequence for forming a double layer metal interconnect structure includes the steps of forming and defining a first metal interconnect layer including portions to serve as the lower electrodes for one or more antifuses, forming and planarizing an inter-metal dielectric layer, forming an antifuse cell opening in the inter-metal dielectric layer, forming an antifuse layer, forming a barrier/capping layer, defining the barrier capping layer and the antifuse layer, forming metal-to-metal via holes in the inter-metal dielectric layer, and forming and defining a second metal interconnect layer.

According to a fifth aspect of the present invention, a process for fabricating a metal-to-metal antifuse in a process sequence for forming a double layer metal interconnect structure includes the steps of forming a first metal interconnect layer including portions to serve as the lower electrodes for one or more antifuses, forming an antifuse material layer, forming a barrier/capping layer, defining the barrier/capping layer, the antifuse material layer, and the first metal interconnect layer including removing the antifuse material layer and the barrier/capping layer from the portion of the first metal interconnect layer to be used for metal-to-metal via contacts, forming and planarizing an inter-metal dielectric layer, simultaneously forming an antifuse cell opening and metal-to-metal via holes in the inter-metal dielectric layer, and forming the second metal interconnect layer.

According to a sixth aspect of the present invention, a process for fabricating a metal-to-metal antifuse in a process sequence for forming a double layer metal interconnect structure includes the steps of forming a first metal interconnect layer including portions to serve as the lower electrodes for one or more antifuses, forming an antifuse material layer, forming a barrier/capping layer, defining the barrier/capping layer, the antifuse material layer, and the first metal interconnect layer, forming and planarizing an inter-metal dielectric layer, forming an antifuse cell opening in the inter-metal dielectric layer, forming metal-to-metal via holes through the inter-metal dielectric layer, the barrier/capping layer, and the antifuse material layer, and forming the second metal interconnect layer.

According to a seventh aspect of the present invention, a process for fabricating a metal-to-metal antifuse in a process sequence for forming a double layer metal interconnect structure includes the steps of forming a first metal interconnect layer including portions to serve as the lower electrodes for one or more antifuses, forming an antifuse material layer, forming a barrier/capping layer, defining the barrier/capping layer, the antifuse material layer, and the first metal interconnect layer, including removing the barrier/capping layer and the antifuse material layer from the surface of the first metal interconnect layer in regions other than where antifuses are to be formed, forming a conformal dielectric layer and etching it to leave sidewall spacers around the regions of the first metal interconnect layer and the first metal interconnect layer covered with the antifuse material layer and the barrier/capping layer, forming and planarizing an inter-metal dielectric layer, simultaneously forming an antifuse cell opening and metal-to-metal via holes through the inter-metal dielectric layer, and forming the second metal interconnect layer.

According to an eighth aspect of the present invention, a process for fabricating a metal-to-metal antifuse in a process sequence for forming a double layer metal interconnect structure includes the steps of forming a first metal interconnect layer including portions to serve as the lower electrodes for one or more antifuses, forming an antifuse material layer, forming a barrier/capping layer, defining the barrier/capping layer, the antifuse material layer, and the first metal interconnect layer, forming a conformal dielectric layer and etching it to leave sidewall spacers around the regions of the first metal interconnect layer covered with the antifuse material layer and the barrier/capping layer, forming and planarizing an inter-metal dielectric layer, forming an antifuse cell opening through the inter-metal dielectric layer, forming metal-to-metal via holes through the inter-metal dielectric layer, the barrier/capping layer, and the antifuse material layer, and forming the second metal interconnect layer.

BRIEF DESCRIPTION OF THE DRAWINGS

Those of ordinary skill in the art will recognize that the drawings are not intended to be interpreted as if the scale used therein is completely accurate. Where necessary, certain features of the various figures may be exaggerated or deemphasized.

DETAILED DESCRIPTION OF PREFERRED EMBODIMENTS

Figure 1A:
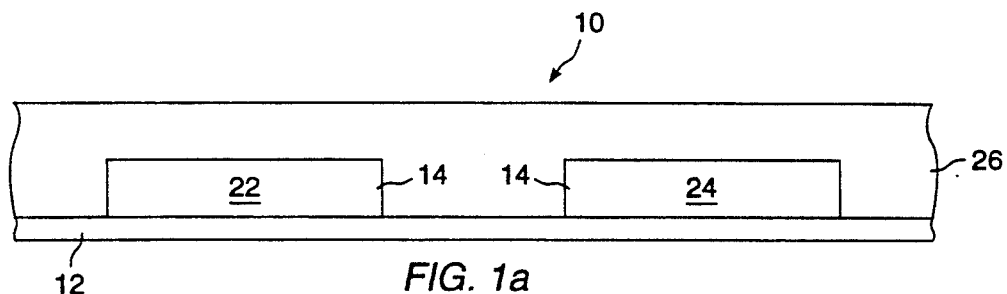
FIGS. 1a-1e are cross sectional views of a portion semiconductor device showing progressive steps in the formation of antifuse and metal to metal contacts according to a prior art fabrication method.

Those of ordinary skill in the art will realize that the following description of the present invention is illustrative only and not in any way limiting. Other embodiments of the invention will readily suggest themselves to such skilled persons from reading the within disclosure.

The present invention relates to the simultaneous formation of a double metal layer metal interconnect structure, such as is used in CMOS integrated circuit technology, and one or more antifuse structures which may be used to selectively connect a portion of the first metal interconnect layer to a portion of the second metal interconnect layer. The metal interconnect layers and antifuse electrodes are formed during the same process sequences and the formation of the antifuse cell openings and the inter-metal vias is integrated into the metallization process. The present invention may be practiced utilizing well known standard semiconductor and material processing techniques. The details of such techniques are well known to those of ordinary skill in the art and will not be recited herein to avoid unnecessarily complicating the disclosure and thus obscuring the invention.

The present invention may be practiced in the environment of a standard CMOS metallization process sequence including two metal interconnect layers. Such a process, which may be referred to as a double-metal CMOS process, usually includes three masking steps. A first metal-defining masking step defines the first level metal interconnect layer, a via-opening masking step defines inter-metal vias, and a second metal-defining masking step defines the second metal interconnect layer. The various embodiments of the invention disclosed herein include either one or two masking steps to form and define the antifuse structure in addition to the above-enumerated masking steps.

In the different drawing figures incorporated herein, the same structural elements of the devices depicted therein have been given the same reference numerals in order to facilitate an understanding of the present invention and avoid confusion. The drawing figures show the simultaneous fabrication of metal-to-metal antifuse elements and conventional inter-metal connections in order to illustrate the processing context in which the present invention exists and to show its various advantages, including compatibility with conventional metallization process sequences in existing processes. Although the present disclosure illustrates the process according to the present invention utilizing a semiconductor substrate, those of ordinary skill in the art will recognize that other substrates, such as ceramic and other insulating substrates, or conductive substrates covered by a suitable insulating layer, may be used.

Referring first to FIGS. 1a–1e, a prior art process for simultaneously forming inter-metal antifuses and inter-metal via connections is illustrated using a series of cross sectional views through a portion of a semiconductor device 10 showing the structure resulting after selected steps in the process have been performed.

As shown in FIG. 1a, a metal-to-metal amorphous silicon antifuse may be fabricated over an underlying insulating layer 12. The underlying insulating layer 12 may be an insulating layer formed over a semiconductor substrate including active regions, or may be the surface of an insulating substrate or the surface of an insulating layer disposed over the surface of a conductive substrate. A first metal layer 14, which serves as a first level metal interconnect layer and lower antifuse electrode, has been deposited and defined over underlying insulating layer 12.

As can be seen in FIG. 1a, conventional photolithography and etching steps have been used to define first level metal interconnect layer 14 into first and second portions 22 and 24 using a first metal-defining mask (not shown). These steps are a part of the conventional metallization sequence in a typical double-metal CMOS process.

After removal of the metal-defining mask used to define first and second portions 22 and 24 of first level metal interconnect layer 14, an inter-metal dielectric layer 26 is formed over the first and second portions 22 and 24 of first level metal interconnect layer 14 and is then planarized. Those of ordinary skill in the art will recognize that the steps described up to this point are conventional steps which are already employed in the metallization sequence of a typical semiconductor device fabrication process. FIG. 1a shows the structure resulting after these steps have been performed.

Figure 1B:
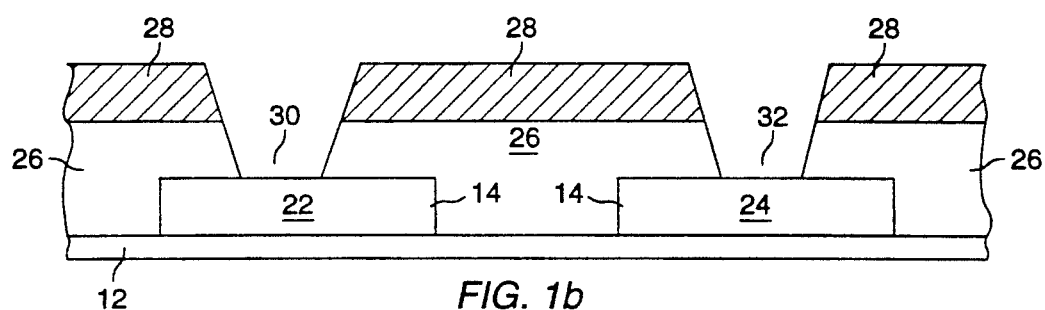

Referring now to FIG. 1b, a via and cell opening masking layer 28 is placed over the surface of inter-metal dielectric layer 26 using conventional photolithography steps. Via and cell opening masking layer 28 is used to define inter-metal via holes and antifuse cell openings in the inter-metal dielectric layer 26. A conventional etching step is then used to simultaneously form via hole 30 in inter-metal dielectric layer 26 over the first portion 22 of first level metal interconnect layer and an antifuse cell opening 32 for an antifuse over second portion 24 of the first level metal interconnect layer. This masking step is already present in the metallization sequence of a typical double-metal CMOS process. FIG. 1b shows the structure resulting after these masking and etching steps have been performed and prior to removal of via and cell opening masking layer 28.

Figure 1C:
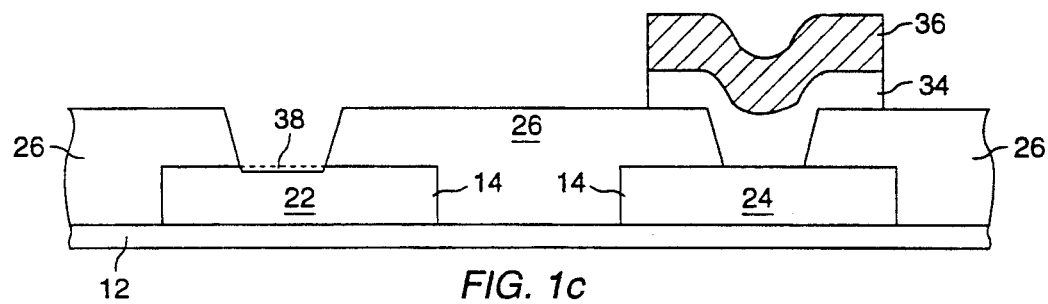

Referring now to FIG. 1c, an antifuse material layer 34 is formed over the surface of inter-metal dielectric layer 26. An antifuse-material defining second masking layer 36 is placed on antifuse material layer 34 and is used as an etch mask for removing antifuse material layer 34 from the surface of the structure everywhere except for the antifuse cell openings 32 and surrounding regions. FIG. 1c shows the structure resulting after the etching step has been performed. Note the dashed line 38 in via hole 30, indicating that a portion of first portion 22 of first level metal interconnect layer 14 is removed during this etch.

Figure 1D:
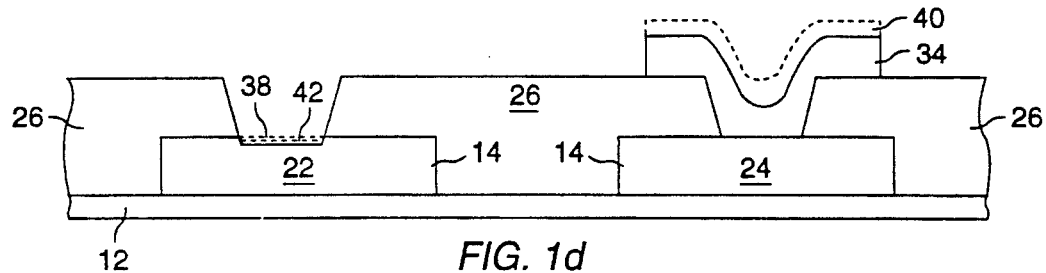

Referring now to FIG. 1d, the second photoresist layer 36 is removed, and the exposed surface of the top layer 20 of first level metal interconnect layer 14 in first region 22 is backsputtered to provide a good conductive surface for contact to a second level metal interconnect layer which is to be deposited on the surface of the structure. FIG. id shows the structure resulting after these steps have been performed.

The dashed lines at reference numeral 40 on the top of antifuse material layer 34 of FIG. 1d indicates that a portion of that layer has been removed by the backsputtering operation. In addition, the dashed lines at reference numeral 42 indicate that further portions of upper layer 20 in via hole 30 are removed during the backsputtering operation. The removal of this material is not precise and can cause problems in the antifuse structure Referring now to FIG. 1e, a second level metal interconnect layer 44 is deposited on the surface of the structure using well known materials processing techniques. Second level metal interconnect layer 44 serves as both a metal interconnect layer and as the upper electrode for one or more antifuses.

Figure 1E:
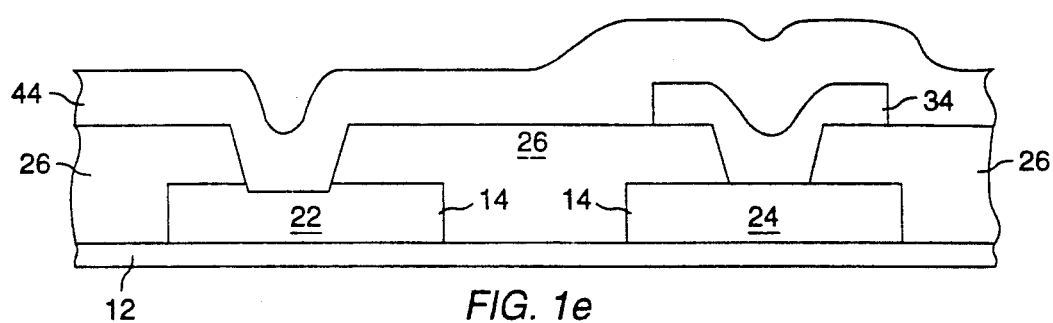

FIG. 1e shows the structure resulting after the steps to form second level metal interconnect layer 44 have been performed. Those of ordinary skill in the art will recognize that conventional back end processing, including the definition of second level metal interconnect layer 44, as well as passivation steps typically preformed in a double-metal CMOS process may now be performed to complete the structure.

Due to the processing which the antifuse structure has undergone, the antifuse structure created by this prior art process is susceptible to one or more problems. First, the top of first level metal interconnect layer 14 which is exposed in via hole 30 in inter-metal dielectric layer 26 is attacked during the step which etches the antifuse material layer not covered by photomask 32 (dashed line 38), due to the lack of a unique and identifiable end point for the etching process. This layer is also subjected to further etching during the backsputtering operation performed prior to deposition of the second metal layer 40 as shown by dashed line 42.

In addition, the antifuse material layer 34 is susceptible to several problems. First, it is highly stressed around the edges of antifuse cell opening 32 which is typical of the stress pattern in thin films. It is also thinner around the edges of antifuse cell opening 32 due to "cusping". This causes breakdown of the antifuse to occur uncontrollably around the edges of the antifuse cell opening. As will be appreciated by those of ordinary skill in the art, the problem becomes more acute for smaller antifuse cell openings, especially those having sub-micron geometries.

In addition, as shown in FIG. 1d, the antifuse material layer 34 is attacked during the backsputtering operation prior to deposition of the second level metal interconnect layer (dashed line 40). This reduces the thickness of the antifuse material layer, makes its thickness less uniform, and may damage its surface and thus deleteriously alter its electrical properties.

Finally, the process illustrated in FIGS. 1a–1e has two distinct compatibility problems. First, it is not compatible with many via plug processes, such as tungsten plug processes. In addition, it is not compatible with antifuse material layers deposited by sputtering due to shadowing.

Figure 2A:
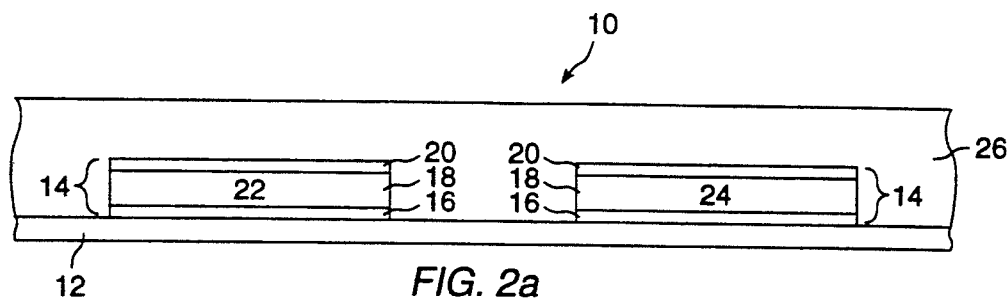
FIGS. 2a-2f are cross sectional views of a portion of a semiconductor device showing progressive steps in the formation of antifuse and metal to metal contacts according to a first embodiment of the present invention.

The present invention comprises several processes for forming metal-to-metal antifuses employing amorphous silicon antifuse material which overcome various limitations of the prior art amorphous silicon antifuse fabrication processes. In order to provide a unique end point for etching of the amorphous silicon stacked antifuse material, to avoid the attacking of the upper layer 20 of first level metal interconnect layer 14 during the etching of the antifuse material, a process according to a first embodiment of the present invention may be utilized, as shown in progression in FIGS. 2a2f. Referring first to FIG. 2a, the process begins by forming first and second portions 22 and 24 of a first level metal interconnect layer 14 over an insulating surface 12.

According to a presently preferred embodiment of the invention, first level metal interconnect layer 14 as used in all of the embodiments disclosed in this application may comprise a multilayer sandwich structure. The multilayer first metal interconnect layer preferably includes a lower layer 16 formed from, for example, TiW. Lower layer 16 is covered by layer 18, formed from, for example AlSiCu. Layer 18 may be covered in turn by an upper layer 20, formed from a material such as TiW.

Those of ordinary skill in the art will recognize that the choice of material or materials to use for the first level metal interconnect layer will depend on device design considerations Non-exhaustive examples of materials for first level metal interconnect layer 14 include TiW/AlSiCu/TiW, TiN/AlSiCu/TiW, TiW/AlSiCu/TiN, TiN/AlSiCu/TiN, AlSiCu/TiW, and AlSiCu/TiN.

First and second portions 22 and 24 of the first level metal interconnect layer 14 are then defined with a metal-defining mask using conventional photolithography and etching steps. Next, an inter-metal dielectric layer 26 is formed, preferably from a layer of silicon dioxide. FIG. 2a shows the structure resulting after formation of inter-metal dielectric layer 26.

Figure 2B:
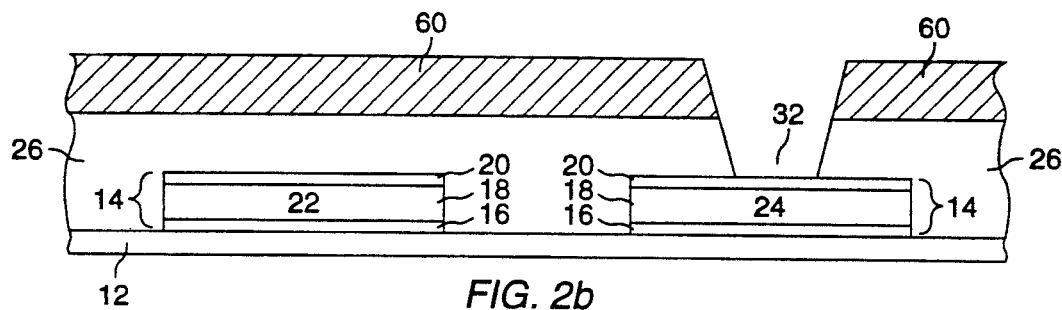

According to this embodiment of the present invention, and as shown in FIG. 2b, a cell-opening masking layer 60 is placed over the surface of inter-metal dielectric layer 26 to form antifuse cell opening 32 over the second portion 24 of the first level metal interconnect layer 14. This mask is not employed in the conventional double-metal CMOS process. FIG. 2b shows the structure resulting after formation of antifuse cell opening 32 and before removal of cell-opening masking layer 60.

Figure 2C:
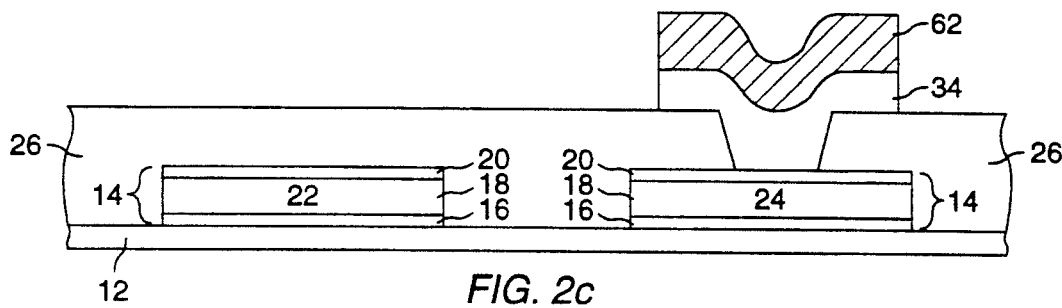

Next, antifuse material layer 34 is formed and patterned using an antifuse-defining masking layer 62 placed over the surface of the structure. In a presently preferred embodiment of the invention, antifuse material layer 34 may comprise a single layer or a multilayer sandwich. Non-exhaustive examples of suitable materials for antifuse material layer 34 for use in all of the embodiments of the present invention disclosed herein include a-Si, nitride/a-Si, a-Si/nitride, nitride/a-Si/nitride, and nitride. In the foregoing examples, the term a-Si (amorphous silicon) is meant to be generic and includes materials ranging from pure amorphous silicon to hydrogenated amorphous silicon with varying hydrogen content a-Si:H and the term nitride is meant to be generic and includes materials from stoichiometric $Si_3N_4$ to $a-Si_xN_y$:H where x ranges from 1 to 3 and y ranges from 0 to 4. Other combinations will suggest themselves to those of ordinary skill in the art. FIG. 2c shows the structure resulting after the defining of antifuse material layer 34 and prior to removal of antifuse defining masking layer 62.

Figure 2D:
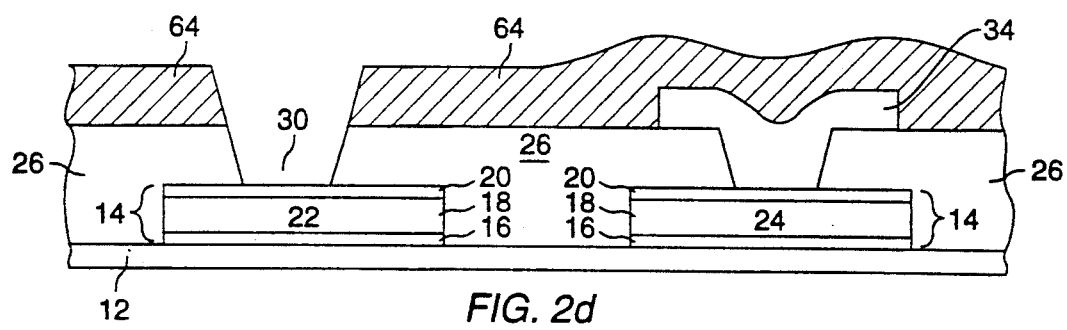

A via-opening masking layer 64 is then placed over the surface of the structure and used to form via hole 30 in inter-metal dielectric layer 26. Those of ordinary skill in the art will recognize that this step is already used in a two-level metal interconnect process. FIG. 2d shows the structure resulting after the formation of via hole 30 and prior to removal of via-opening masking layer 64.

Figure 2E:
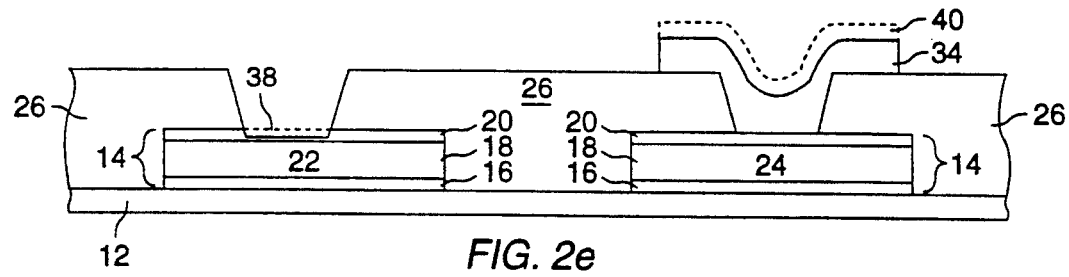

Next, as shown in FIG. 2e, the via-opening masking layer 64 is removed, and the exposed surface of the top layer 20 of first portion 22 of the first level metal interconnect layer 14 is backsputtered to provide a good conductive surface for contact to the second level metal interconnect layer which is to be deposited on the surface of the structure. FIG. 2e shows the structure resulting after these steps have been performed. The dashed lines at reference numeral 40 on the top of antifuse material layer 34 indicates that a portion of that layer has been removed by the backsputtering operation. In addition, the dashed lines at reference numeral 38 indicate that portions of upper layer 20 of first portion 22 of first level metal interconnect layer 14 in via hole 30 are also removed during this operation.

Figure 2F:
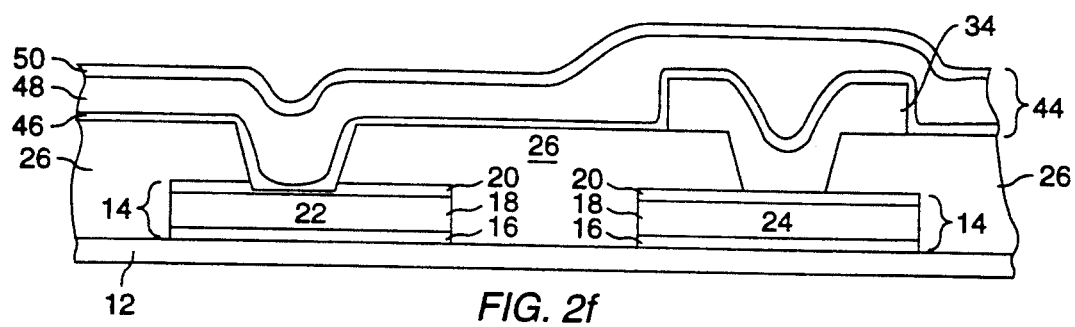

Finally, as shown in FIG. 2f, a second level metal interconnect layer 44 is deposited on the surface of the structure using well known materials processing techniques. Second metal layer 44 may comprise a composite of more than one layer, indicated by reference numerals 46, 48, and 50. It is presently preferred for all embodiments disclosed herein that second level metal interconnect layer 44 comprise a layer of AlSiCu, TiW/AlSiCu, or TiN/AlSiCu. Alternately, second level metal interconnect layer 44 may comprise materials as disclosed herein for use as the first metal interconnect layer 14. Second level metal interconnect layer 44 is shown in the drawing figures herein as a multilayer structure comprising layers identified by reference numerals 46, 48, and 50, respectively. These layers preferably comprise TiW, AlSiCu, and TiW, respectively. FIG. 2f shows the structure resulting after these steps have been performed. As in the embodiment of FIGS. 1a-1e, the second level metal interconnect layer 44 may be conventionally defined by use of a second metal-defining masking step.

As can be seen from an examination of FIGS. 2a-2f, use of the process according to this embodiment of the present invention avoids etching the upper layer 20 during the etch of the antifuse material layer 34, but at the expense of the extra photolithography sequence necessary to separately form via hole 30 and antifuse cell opening 32. This embodiment of the invention utilizes two more masking steps (cell opening mask 60 in FIG. 2b and antifuse patterning mask 62 in FIG. 2c)) in addition to the three masking steps already present in the metallization sequence of a double-metal CMOS process.

Several alternative processing solutions to the above-described problems are provided by other embodiments of the present invention. A process according to a second embodiment of the present invention is most easily understood with reference to FIGS. 3a-3e.

Figure 3A:
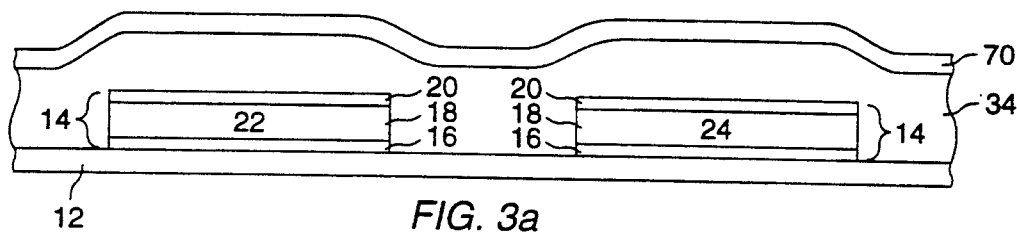
FIGS. 3a-3e are cross sectional views of a portion of a semiconductor device showing progressive steps in the formation of antifuse and metal to metal contacts according to a second embodiment of the present invention.

Referring first to FIG. 3a, the process sequence according to this embodiment of the present invention commences by forming and defining first and second portions 22 and 24 of a first level metal interconnect layer 14 over insulating layer 12 using a first metal-defining masking step. Instead of forming inter-metal dielectric layer 26 as in the processes according to the first embodiment disclosed herein, antifuse material layer 34 is formed at this point in the process.

Next, a barrier/capping layer 70 is formed over antifuse material layer using conventional processing techniques. FIG. 3a shows the structure resulting after antifuse material layer 34 and barrier/capping layer 70 have been formed. Barrier/capping layer 70 may be formed from TiW, TiN, Mo, Cr, or similar materials used in semiconductor structures.

Figure 3B:
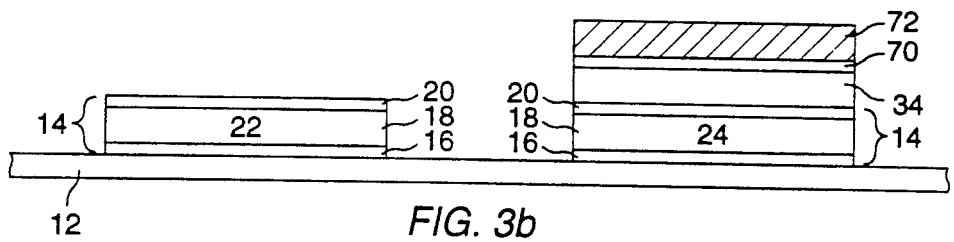

Referring now to FIG. 3b, a masking layer 72 is applied over barrier/capping layer 70, and is exposed and developed using conventional photolithography steps, and is used as a mask to pattern antifuse material layer 34 and the barrier/capping layer 70 on top of second portion 22 of the first level metal interconnect layer 14 by employment of conventional etching techniques. FIG. 3b shows the structure resulting after these steps have been performed and prior to removal of masking layer 72. Note that antifuse material layer 34 and barrier/capping layer 70 have been removed from first portion 22 of first level metal interconnect layer 14.

Figure 3C:
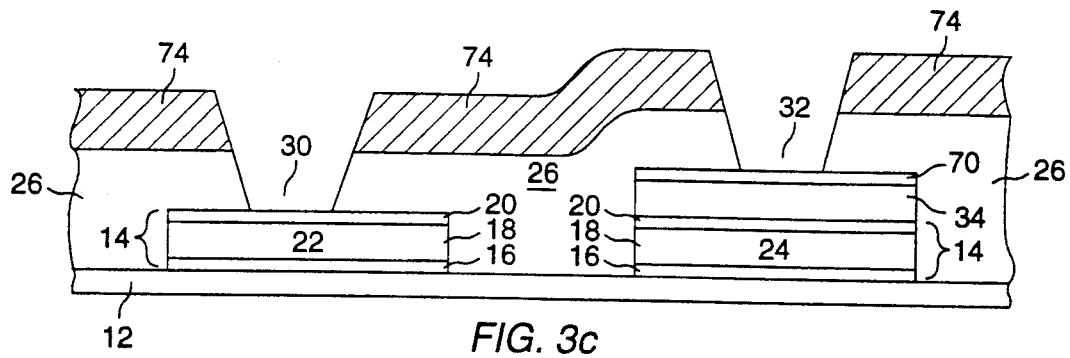

Referring now to FIG. 3c, masking layer 72 is removed and an inter-metal dielectric layer 26, preferably comprising deposited silicon dioxide, is formed and planarized. A via and cell opening masking layer 74 is applied over inter-metal dielectric layer 26, developed and exposed using conventional photolithography steps, and is used as a mask to define inter-metal via hole 30 and antifuse cell opening 32, which are formed in inter-metal dielectric layer 26 using conventional etching techniques. This mask is already employed in a double metal-interconnect process and need only be modified to include the geometry of the cell opening 32. FIG. 3c shows the structure resulting after these steps have been performed and prior to removal of via and cell opening masking layer 74.

Figure 3D:
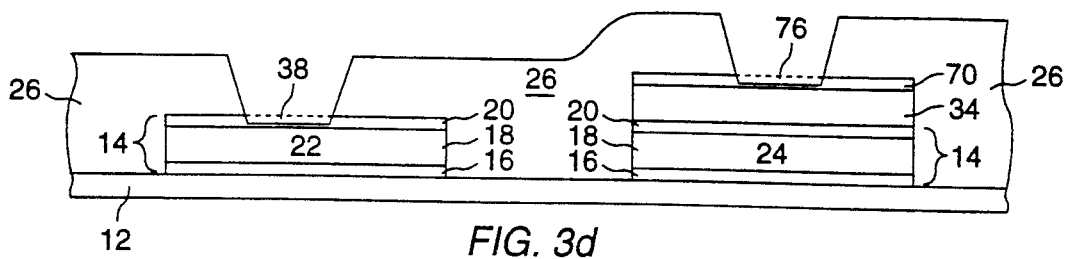

Next, as shown in FIG. 3d, the via and cell opening masking layer 74 is removed, and the exposed surface of the top layer 20 of the first level metal interconnect layer 14 and barrier/capping layer 70 are backsputtered to provide a good conductive surface for contact between the first level metal interconnect layer 14 and the antifuse and the second level metal interconnect layer which is to be deposited on the surface of the structure. FIG. 3d shows the structure resulting after these steps have been performed. The dashed lines at reference numeral 76 on the top of barrier/capping layer 70 indicates a portion of that layer as having been removed by the backsputtering operation. In addition, the dashed lines at reference numeral 38 indicate portions of upper layer 20 in via hole 30 removed during this operation.

Figure 3E:
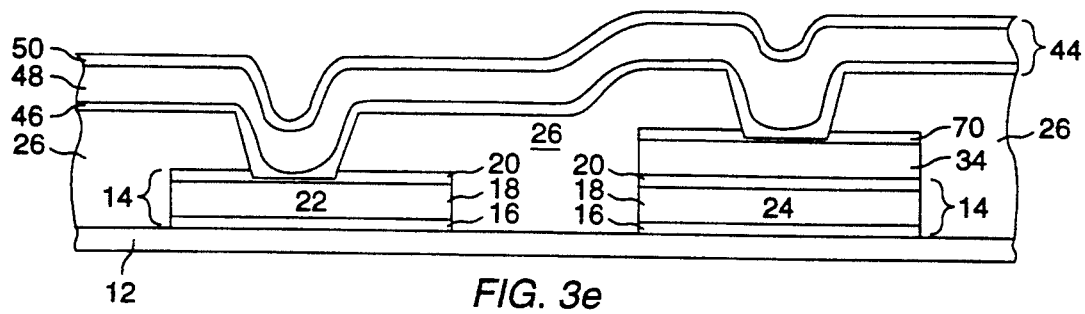

Referring now to FIG. 3e, second level metal interconnect layer 44, indicated as a multi-layer structure at reference numerals 46, 48, and 50, is formed over the surface of intermetal dielectric 26 and makes conductive contact with the upper layer 20 of first level metal interconnect layer 14 and barrier/capping layer 70. FIG. 3e shows the structure resulting after this step has been performed. A second metal-defining masking step (not shown) may then be used to definer the second level metal interconnect layer 44.

Those of ordinary skill in the art will appreciate that the embodiment illustrated in FIGS. 3a-3e utilizes two masking steps in addition to the double-metal CMOS metallization sequence masking steps. The first additional masking step is used to define the antifuse material layer and the second additional masking step is used to form the antifuse cell openings in the inter-metal dielectric layer.

As can be seen from FIGS. 3a-3e, the process according to the second embodiment of the present invention described with respect thereto provides an antifuse structure between two levels of metal interconnect which eliminates the potential problems inherent in the prior art process described herein.

First, the upper layer 20 of the first level metal interconnect layer 14 is not exposed at the bottom of via hole 30 in the process according to this embodiment and is thus not attacked during the antifuse material layer etch. In addition, the problems of antifuse material layer stress, thinning of antifuse material layer film at the edges of antifuse cell opening 32, stressing of antifuse material layer, attacking of the antifuse material layer during backsputtering and compatibility of sputter deposited antifuse material layers due to shadowing are eliminated. In addition, the process is compatible with a wider range of via plug processes.

Figure 4A:
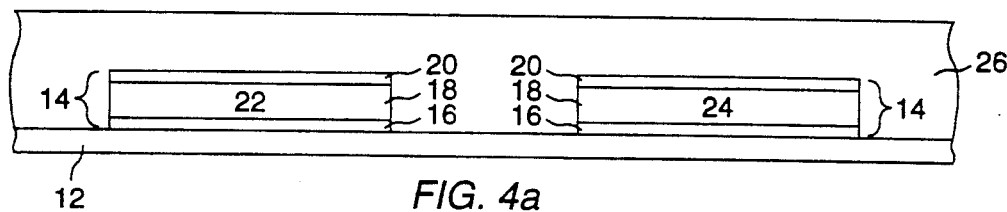
FIGS. 4a–4e are cross sectional views of a portion of a semiconductor device showing progressive steps in the formation of antifuse and metal to metal contacts according to a third embodiment of the present invention.

A third embodiment of a process according to the present invention may be most easily understood with reference to FIGS. 4a-4e. Referring first to FIG. 4a, the process sequence commences by forming and defining first and second portions 22 and 24 of first level metal interconnect layer 14 over insulating layer 12. The conventional first metal-defining masking layer used to define first and second portions 22 and 24 is then removed and an inter-metal dielectric layer 26 is then formed and planarized over the surface of the structure using conventional semiconductor processing techniques. FIG. 4a shows the structure resulting after these steps have been performed.

Figure 4B:
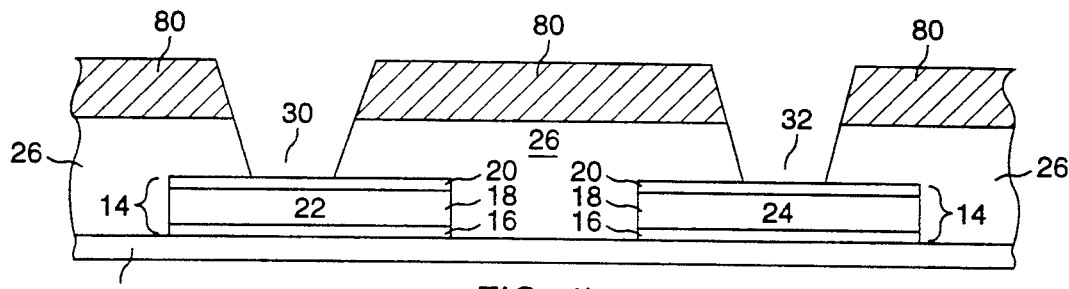

Referring now to FIG. 4b, a via and cell opening masking layer 80 is applied over inter-metal dielectric layer 26. Via and cell opening masking layer 80 is used to define inter-metal via hole 30 and antifuse cell opening 32 in inter-metal dielectric layer 22 which are formed using conventional etching techniques. As in the embodiment shown in FIGS. 3a-3e, this masking layer is already employed to form the via holes 30 and need only be modified to include the geometry for cell opening 32. FIG. 4b shows the structure resulting after these steps have been performed and prior to removal of first masking layer 80.

Figure 4C:
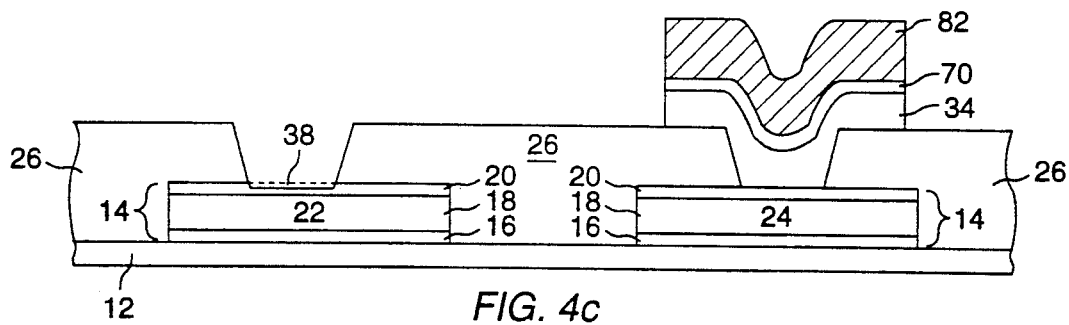

Referring now to FIG. 4c, via and cell opening masking layer 80 is removed and antifuse material layer 34 is formed. Barrier/capping layer 70 is next formed over the surface of antifuse material layer 34. Antifuse material layer 34 and barrier/capping layer 70 are then patterned using an antifusedefining second masking layer 82 placed over the surface of the structure. This masking layer is not present in the typical double-metal CMOS processes. FIG. 4c shows the structure resulting after the defining of antifuse material layer 34 and barrier/capping layer 70 and prior to removal of second masking layer 82. Note the dashed line 38 in via hole 30, indicating that a portion of upper layer 20 has been removed during this etch.

Figure 4D:
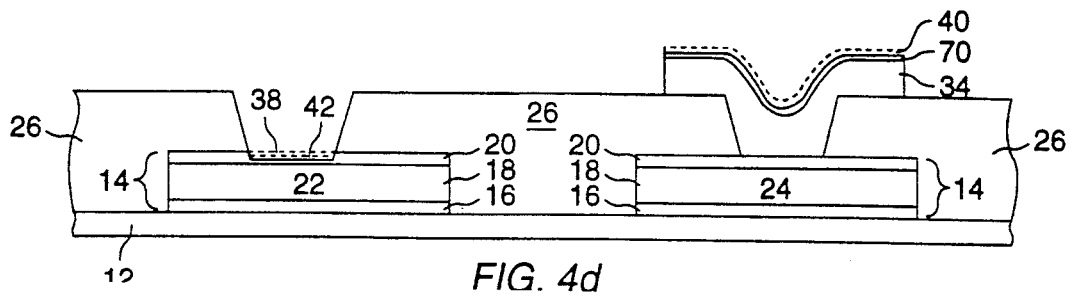

Referring now to FIG. 4d, the second photoresist layer 82 is removed, and the exposed surfaces of the upper layer 20 of the first level metal interconnect layer 14 and barrier/capping layer 70 for the second level metal interconnect layer are backsputtered to provide a good conductive surface for contact from the first level metal interconnect layer and the antifuse to the second level metal interconnect layer which is to be deposited on the surface of the structure. FIG. 4d shows the structure resulting after these steps have been performed. The dashed lines at reference numeral 40 on the top of barrier/capping layer 70 indicates that a portion of that layer has been removed by the backsputtering operation. As may be seen from FIG. 4d, the use of this layer protects antifuse material layer 34 from being etched during the backsputtering operation. In addition, the dashed lines at reference numeral 42 indicate that additional portions of upper layer 20 in via hole 30 are removed during this operation.

Figure 4E:
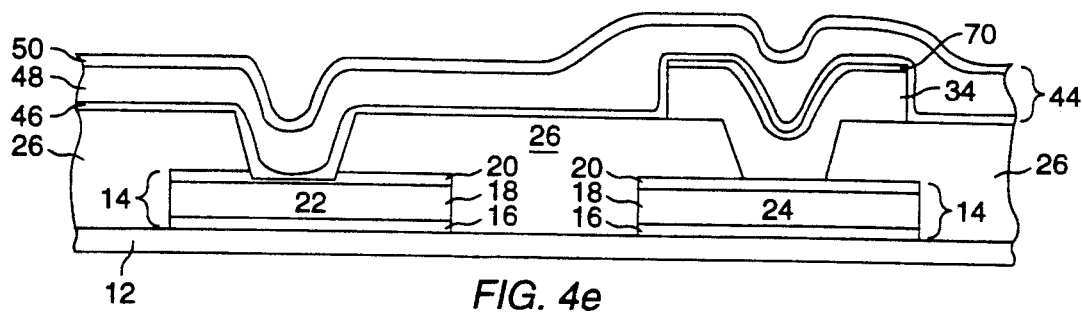

Referring now to FIG. 4e, second level metal interconnect layer 44 comprising layers 46, 48, and 50 is formed over the surface of inter-metal dielectric 26 and makes conductive contact with the top of first metal layer 14 and barrier/capping layer 70. FIG. 4e shows the structure resulting after this step has been performed. Additional steps employing a second metaldefining masking layer (not shown) are used to define the second metal layer and complete the integrated circuit structure.

As can be seen from FIGS. 4a-4e, the process according to the embodiment of the present invention described with respect thereto eliminates the problem of attacking antifuse material 34 during the backsputtering step in the prior art processes. This embodiment of the present invention utilizes one masking step (mask 82, used to define the antifuse material 34) in addition to the masking steps already present in the metallization sequence of the double-metal CMOS process. Relative to the embodiment described with reference to FIGS. 3a-3e, the present embodiment provides a smaller antifuse capacitance—a desirable feature for high speed operations.

Figure 5A:
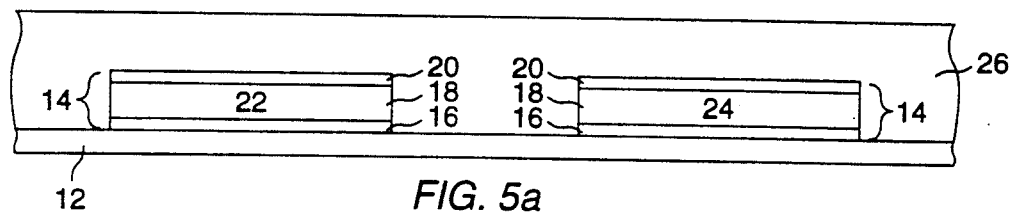
FIGS. 5a–5f are cross sectional views of a portion of a semiconductor device showing progressive steps in the formation of antifuse and metal to metal contacts according to a fourth embodiment of the present invention.

A fourth embodiment of a process according to the present invention is most easily understood with reference to FIGS. 5a-5f. Referring first to FIG. 5a, the process sequence commences by forming and defining first and second portions 22 and 24 of first level metal interconnect layer 14 over insulating layer 12 using a first metal-defining masking layer (not shown). An inter-metal dielectric layer 26 is then formed and planarized over the surface of the structure. FIG. 5a shows the structure resulting after these steps have been performed.

Figure 5B:
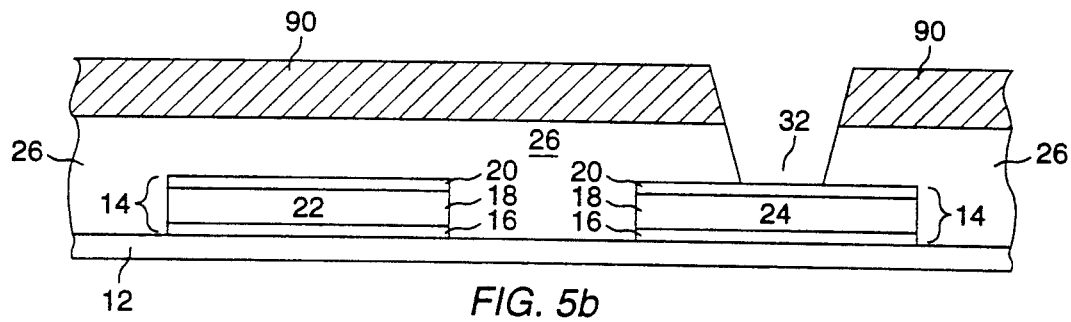

Referring now to FIG. 5b, a cell-opening masking layer 90 is applied over inter-metal dielectric layer 26. Cell-opening masking layer 90 is used as a mask to define antifuse cell opening 32 in inter-metal dielectric layer 26. Antifuse cell opening 32 is then formed using conventional etching techniques. FIG. 5b shows the structure resulting after these steps have been performed.

Figure 5C:
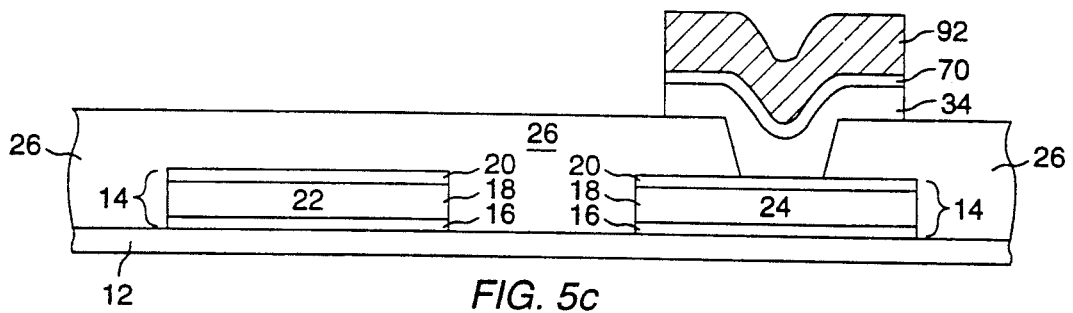

Referring now to FIG. 5c, cell-opening masking layer 90 is removed and antifuse material layer 34 is formed. Barrier/capping layer 70 is next formed over the surface of antifuse material layer 34. Antifuse material layer 34 and barrier/capping layer 70 are then patterned using an antifuse material defining masking layer 92 placed over the surface of the structure. Antifuse material defining masking layer 92 is not present in the typical double-metal CMOS process. FIG. 5c shows the structure resulting after the defining of antifuse material layer 34 and barrier/capping layer 70 and prior to removal of antifuse material defining masking layer 92.

Figure 5D:
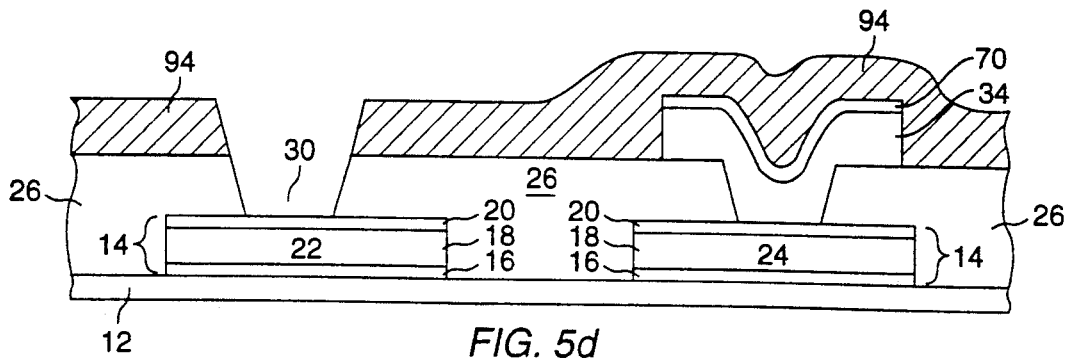

Referring now to FIG. 5d, a via-opening masking layer 94 is then placed over the surface of the structure and used to form via hole 30 in inter-metal dielectric layer 26. Via-opening masking layer 94 is employed in conventional double-metal CMOS processes to form inter-metal vias. FIG. 5d shows the structure resulting after the formation of via hole 30 and prior to removal of via-opening masking layer 94.

Figure 5E:
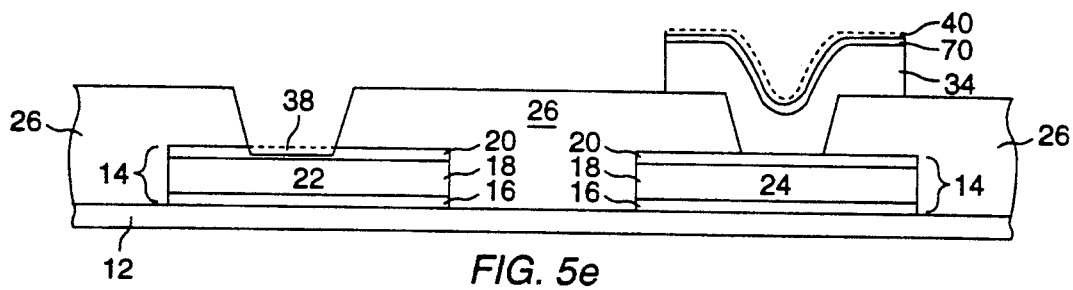

Referring now to FIG. 5e, via-opening masking layer 94 is removed, and the exposed surface of the upper layer 20 of first level metal interconnect layer 14 and barrier/capping layer 70 are backsputtered to provide a good conductive surface for contact from the first level metal interconnect layer and the antifuse to the second level metal interconnect layer which is to be deposited on the surface of the structure. FIG. 5e shows the structure resulting after these steps have been performed. The dashed lines at reference numeral 40 on the top of barrier/capping layer 70 indicates that a portion of that layer is removed by the backsputtering operation. As may be seen from FIG. 5e, the use of this layer protects antifuse material layer 34 from being etched during the backsputtering operation. In addition, the dashed lines at reference numeral 38 indicate that portions of layer 20 in via hole 30 are removed during this operation.

Figure 5F:
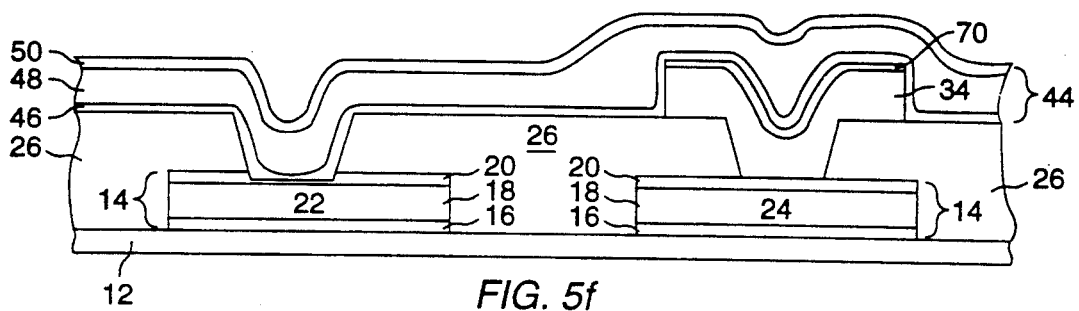

Referring now to FIG. 5f, second level metal interconnect layer 44 incorporating layers 46, 48, and 50, is formed over the surface of inter-metal dielectric 26 and makes conductive contact with the top layer 20 of the first level metal interconnect layer 14 and barrier/capping layer 70. FIG. 5f shows the structure resulting after this step has been performed. The conventional processing sequence may then be utilized to define the second level metal interconnect layer 44 using a second metal-defining masking layer (not shown). Those of ordinary skill in the art will observe that this embodiment requires two masking steps in addition to the ones normally used in the metallization sequence of a double-metal CMOS process. One defines the antifuse material layer 34 and the other is used to form the cell opening 32.

As can be seen from FIGS. 5a-5f, the process according to the embodiment of the present invention described with respect thereto also eliminates the problems of attacking the antifuse material 34 during backsputtering inherent in the processes according to the first and second embodiments of the invention described herein. The upper layer 20 of first level metal interconnect layer 14 is not exposed in via hole 30 and is thus not attacked during the antifuse material layer etch. Capping/barrier layer 70 protects the antifuse material layer 34.

As the current trend towards smaller, denser, and faster circuits progresses, it becomes increasingly advantageous to employ structures which are more compact and have minimum capacitance. The present invention provides such structures and methods for their fabrication.

Referring now to FIGS. 6a-6e, a fifth embodiment of the present invention allows fabrication of a denser antifuse structure than is possible using the other previously described embodiments of the invention.

Figure 6A:
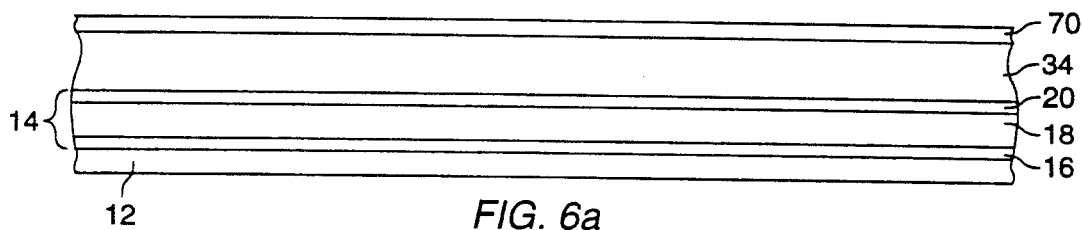
FIGS. 6a–6e are cross sectional views of a portion of a semiconductor device showing progressive steps in the formation of antifuse and metal to metal contacts according to a fifth embodiment of the present invention.

Referring first to FIG. 6a, a first level metal interconnect layer 14 is formed over an underlying insulating layer 12. The first level metal interconnect layer is covered by a layer of antifuse material 34. Antifuse layer 34 is covered by a barrier/capping layer 70. FIG. 6a shows the structure resulting after formation of the barrier/capping layer 70.

Figure 6B:
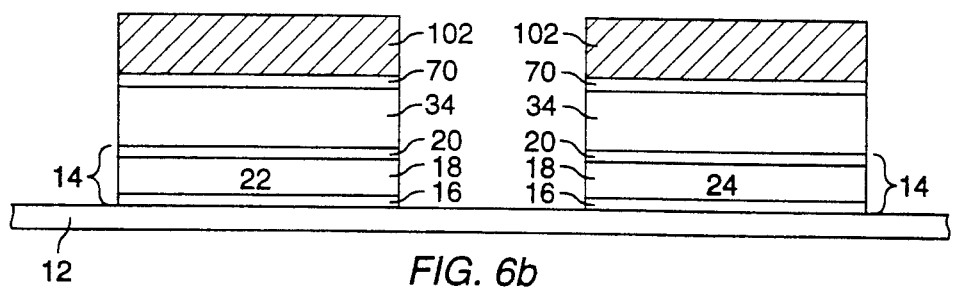

Referring now to FIG. 6b, a first metal-defining masking layer 102 is placed over the top of barrier/capping layer 70 and the underlying first level metal interconnect layer is defined into first portion 22 and second portion 24. Those of ordinary skill in the art will recognize that first metal defining masking layer 102 is one of the masking layers conventionally employed in the metallization process to pattern the first level metal interconnect layer 14. First metal-defining masking layer 102 is then removed.

Figure 6C:
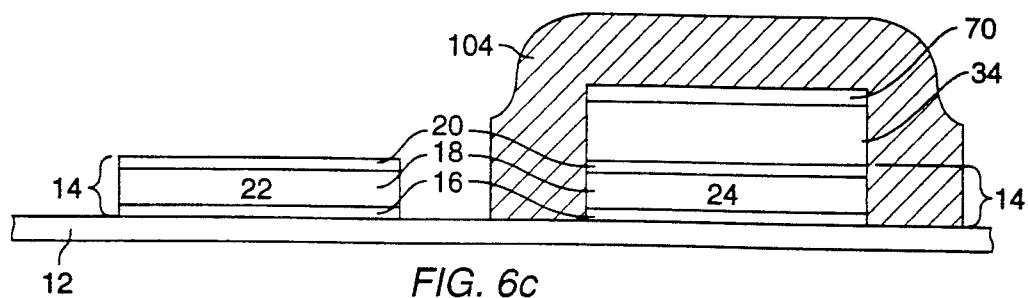

Referring now to FIG. 6c, a masking layer 104 is placed over second portion 24 of the first level metal interconnect layer 14 and the barrier/capping layer 70 and antifuse layer 34 are removed from the top of first portion 22 of first level metal interconnect layer 14 by conventional etching techniques. FIG. 6c shows the structure resulting after the performance of the etching step and prior to removal of masking layer 104.

Figure 6D:
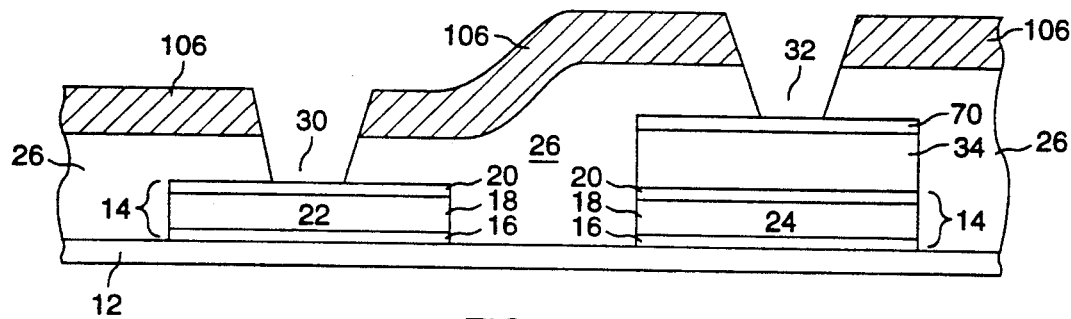

Referring now to FIG. 6d, masking layer 104 is removed and an inter-metal dielectric layer 26 is formed over the surface of the structure. A via and cell opening masking layer 106 is placed over the inter-metal dielectric layer 26 and is used as an etch mask to form via hole 30 and antifuse cell opening 32 therein, exposing the top of the first level metal interconnect layer 14 in first portion 22 and the barrier/capping layer in second portion 24. As in the embodiments of FIGS. 1a-1e, 3a-3e, and 4a-4e, this masking layer is conventionally employed to open the inter-metal vias and is modified to include the geometry for the cell opening 32. FIG. 6d shows the structure resulting after the performance of the etching step forming via hole 30 and antifuse cell opening 32 and prior to removal of the via and cell opening masking layer 104.

Figure 6E:
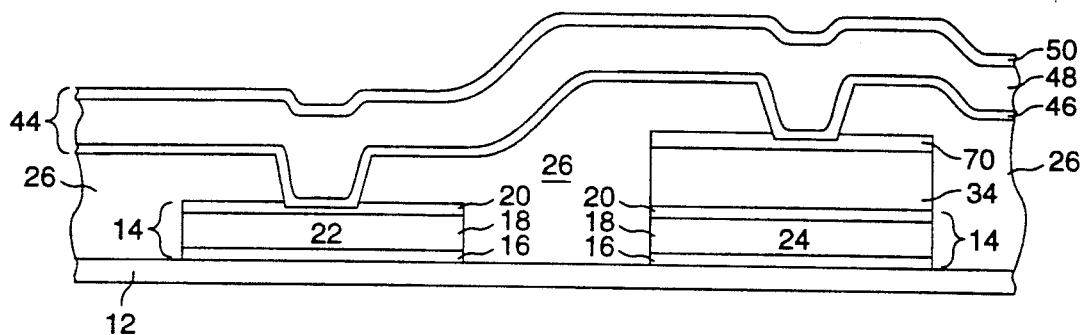

Referring now to FIG. 6e, via and cell opening masking layer 106 is removed and a second level metal interconnect layer 44, which may include layers 46, 48, and 50 is formed over the inter-metal dielectric layer 26 and in contact with the top of the first portion 22 of the first level metal interconnect layer 14 and the barrier/capping layer 70. Additional conventional processing may be employed to define the second level metal interconnect layer 44 using a second metal-defining masking layer (not shown).

The structure resulting from the performance of the process according to this embodiment of the present invention has a higher density and lower antifuse capacitance than the structures produced according to the previously described embodiments of the invention shown in FIGS. 3a-3e because the antifuse is self aligned to the first level metal.

Figure 7A:
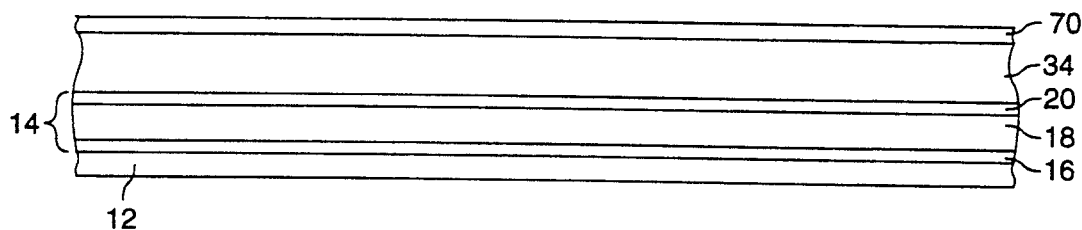
FIGS. 7a–7e cross sectional views of a portion of a semiconductor device showing progressive steps in the formation of antifuse and metal to metal contacts according to a sixth embodiment of the present invention.

A variation of the process disclosed with reference to FIGS. 6a-6e is shown with reference to FIGS. 7a-7e. Referring first to FIG. 7a, a first level metal interconnect layer 14 is formed over an underlying insulating layer 12. The first level metal interconnect layer 14 is covered by a layer 34 of antifuse material. Antifuse layer 34 is covered by a barrier/capping layer 70.

A first metal-defining masking layer (not shown) is placed over the top of barrier/capping layer 70 and the underlying structure is patterned. Those of ordinary skill in the art will recognize that this mask is already employed in the conventional metallization process to pattern the first level metal interconnect layer.

Figure 7B:
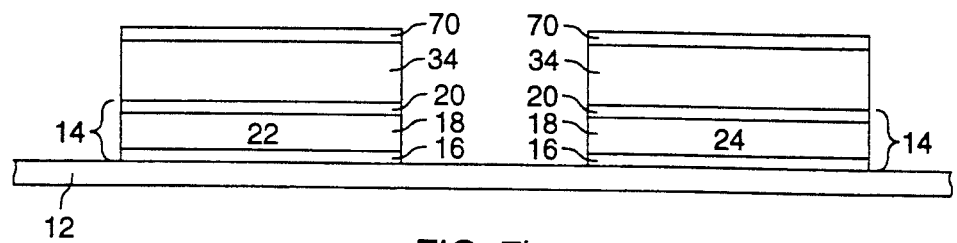

In FIG. 7b, first and second portions 22 and 24 of the first level metal interconnect layer 14 are shown after definition of the first level metal interconnect layer and illustrate, respectively, the formation of an inter-metal contact and an antifuse structure. FIG. 7b shows the structure resulting after the first metal-defining masking layer is removed.

Figure 7C:
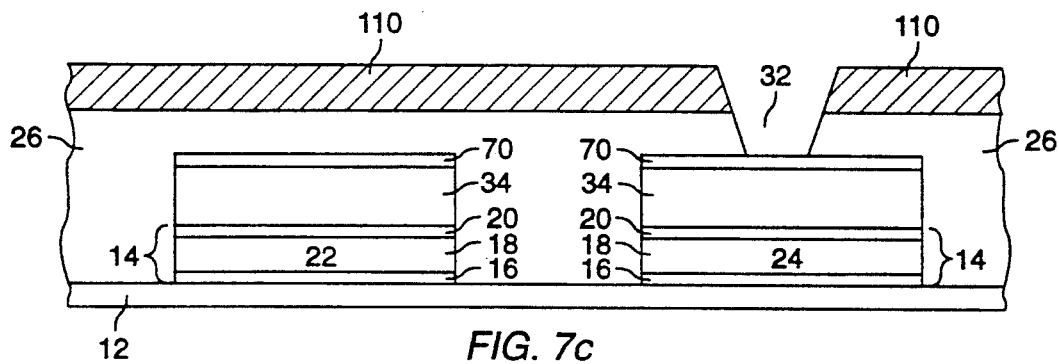

Referring now to FIG. 7c, an inter-metal dielectric layer 26 is formed over the surface of the structure. A cell-opening masking layer 110 is placed over the inter-metal dielectric layer 26 and is used as an etch mask to form antifuse cell opening 32 therein, exposing the top of the barrier/capping layer 70 on top of second portion 24 of the first level metal interconnect layer 14. FIG. 7c shows the structure resulting after the performance of the etching step forming antifuse cell opening 104 and prior to removal of the cell-opening masking layer 110.

Figure 7D:
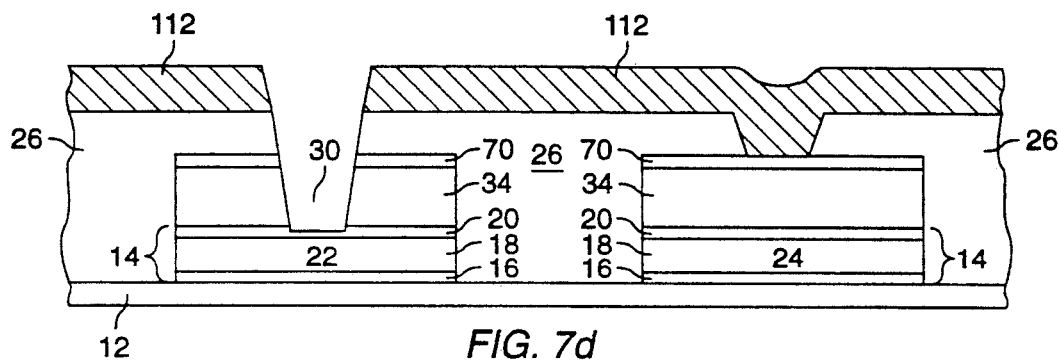

Referring now to FIG. 7d, cell-opening masking layer 110 is removed and a via-opening masking layer 112 is placed over the surface of the structure to define the via hole 30. Via-opening masking layer 112 covers the antifuse cell opening 32 to protect it during the formation of the via hole 30. The via hole 30 is then etched through the inter-metal dielectric layer 26, barrier/capping layer 70, and antifuse layer 34 to expose the upper surface of first portion 22 of the first level metal interconnect layer 14. FIG. 7d shows the structure resulting after the performance of the etching step forming via hole 30 and prior to removal of the via-opening masking layer 112.

Figure 7E:
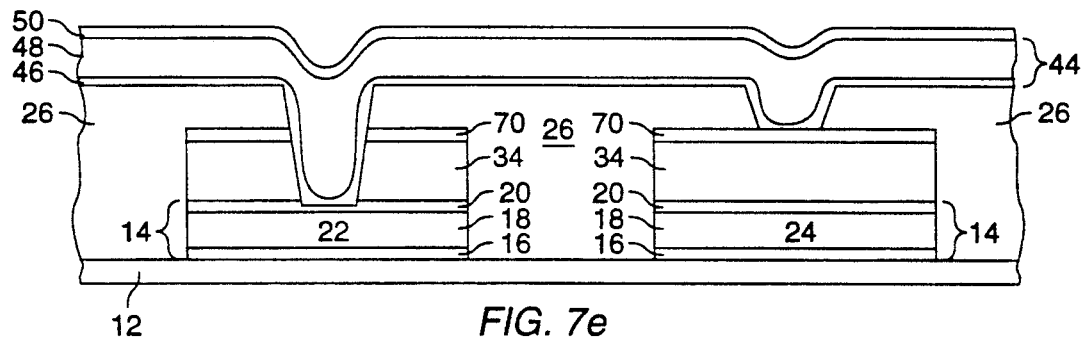

Referring now to FIG. 7e, a second level metal interconnect layer 44, which may include layers 46, 48, and 50, is formed over the inter-metal dielectric layer 26 and in contact with the top of the first portion 22 of the first level metal interconnect layer 14 and the barrier/capping layer 70 in the antifuse cell opening 32. Additional conventional steps are then employed to define the second level metal interconnect layer 44.

The advantage of the embodiment described with respect to FIGS. 7a-7e is that the surface of first portion 22 of the first level metal interconnect layer 14 is exposed to etching (ambient species) only once.

Figure 8A:
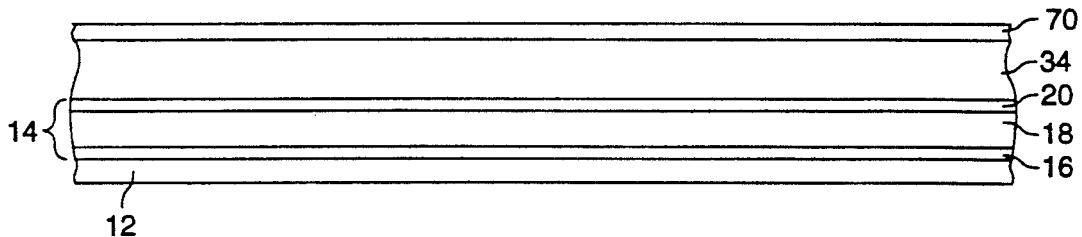
FIGS. 8a–8g are cross sectional views of a portion of a semiconductor device showing progressive steps in the formation of antifuse and metal to metal contacts according to a seventh embodiment of the present invention.

Referring now to FIGS. 8a-8g, an embodiment of the present invention which allows fabrication of metal-to-metal antifuse structures having reduced capacitance and increased density is shown. Referring first to FIG. 8a, a first level metal interconnect layer 14 is formed over an underlying insulating layer 12. The first level metal interconnect layer is covered by a layer 34 of antifuse material. Antifuse layer 34 is covered by a barrier/capping layer 70.

A metal-defining masking layer (not shown) is placed over the top of barrier/capping layer 70 and the underlying structure is patterned. Those of ordinary skill in the art will recognize that this metal-defining masking layer is already employed in the conventional metallization process used to pattern the first level metal interconnect 14.

Figure 8B:
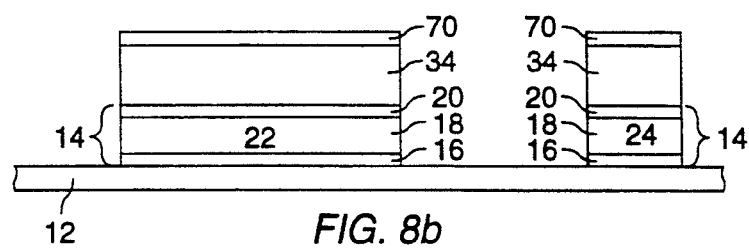

In FIG. 8b, first and second portions 22 and 24 of the first level metal interconnect layer 14 are shown after definition and illustrate the formation of an inter-metal contact and an antifuse structure, respectively. FIG. 8b shows the structure resulting after the metal-defining masking layer has been removed.

Figure 8C:
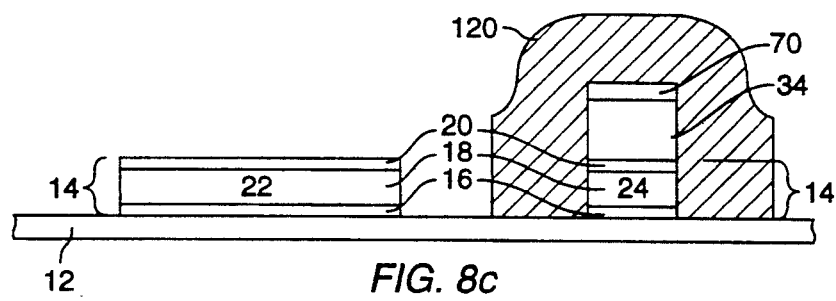

Referring now to FIG. 8c, a masking layer 120 is placed over second portion 24 of the first level metal interconnect layer 14 and the barrier/capping layer 70 and antifuse layer 34 are removed from the top of first portion 22 of the first level metal interconnect layer 14. FIG. 8b shows the structure resulting after the performance of the etching step and prior to removal of the masking layer 120.

Figure 8D:
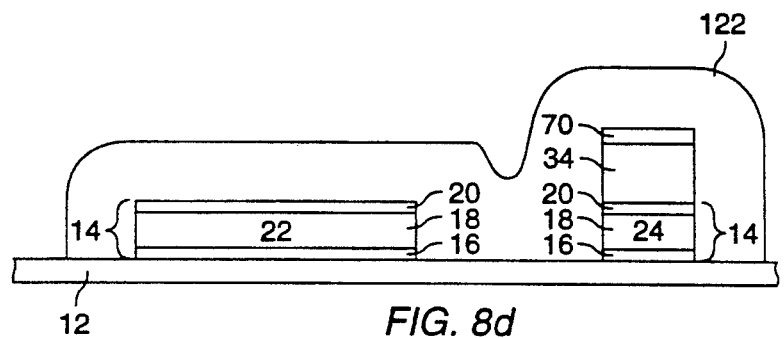

Referring now to FIG. 8d, the masking layer 120 is removed and a conformal dielectric layer 122 is placed over the surface of the structure. Conformal dielectric layer 122 may be formed from materials such as silicon nitride using fabrication techniques well known in the art.

Figure 8E:
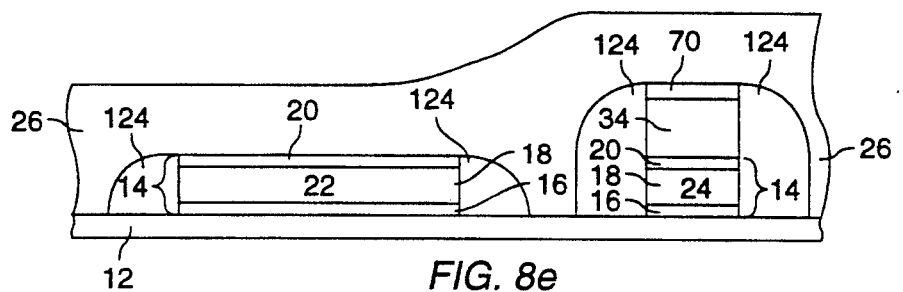

Referring now to FIG. 8e, an etching step is performed, leaving sidewall spacer 124 on the structure comprising second portion 24 of the first level metal interconnect layer 14 covered by antifuse material 34 and barrier/capping layer 70. Similar sidewall spacers are left on the sides of the structure comprising first portion 22 of the first metal interconnect layer 14. An inter-metal dielectric layer 26 is then formed over the surface of the structure. FIG. 8e shows the structure after these steps have been performed.

Figure 8F:
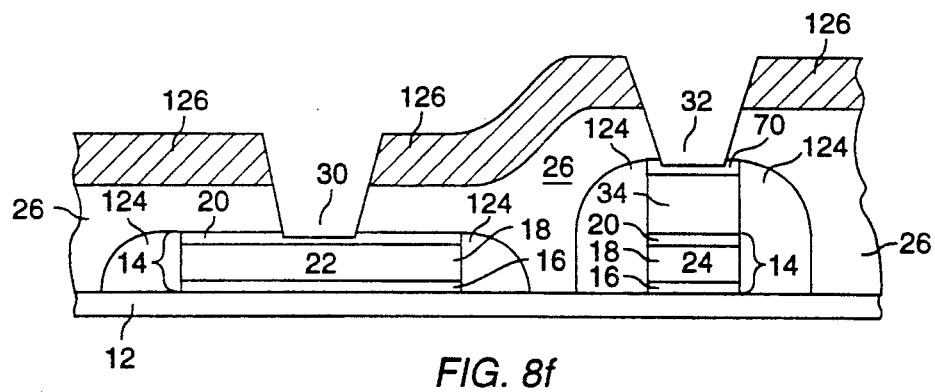

Referring now to FIG. 8f, a via-opening masking layer 126 is placed over the surface of the structure to define via hole 30 and antifuse cell opening 32. FIG. 8f shows the structure resulting after via hole 30 and antifuse cell opening 32 have been etched through inter-metal dielectric layer 26 but prior to removal of via-opening masking layer 126.

Figure 8G:
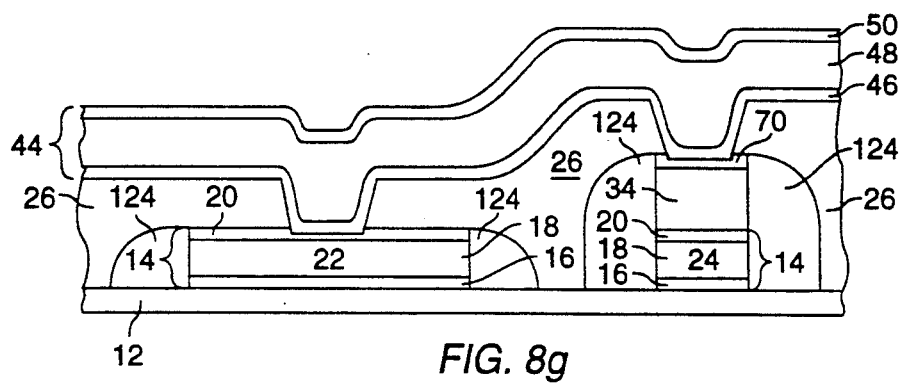

Referring now to FIG. 8g, a second level metal interconnect layer 44, which may include layers 46, 48, and 50, is formed over the inter-metal dielectric layer 26 and in contact with the upper surface of first portion 22 of the first level metal interconnect layer 14 and the barrier/capping layer 70 in the antifuse cell opening 32. Additional steps, not shown, may be employed to define the second level metal interconnect layer 44.

Those of ordinary skill in the art will note that when this embodiment of the present invention is practiced, the misalignment tolerance of the photolithography steps which are used to form antifuse cell opening 32 is greatly increased, thus allowing use of minimum feature size line widths for the second portion 24 of the first level metal interconnect layer 14. Because of the presence of the insulating sidewall spacer 124 on the sides of second portion 2 of the first level metal interconnect layer 14, lateral misalignment of antifuse cell opening 32 (i.e., to the right or to the left of the center of second portion 24 of first level metal interconnect layer 14 in FIG. 8d) will not result in shorts or reliability problems caused by exposing the side surface of the antifuse material layer 34 or the side surface of the first level metal interconnect layer 14.

Because of this feature of this embodiment of the present invention, design rules are possible which allow the antifuse cell opening 32 to be misaligned such that the edge of the cell opening aperture 32 may extend beyond the edge of the first level metal interconnect layer 14. Those of ordinary skill in the art will realize that the width of first level metal interconnect layer 14 may be minimized in the region of the antifuse without compromising antifuse reliability. Since the capacitance of the antifuse in its unprogrammed state is proportional to the area of the first level metal interconnect layer 14 comprising the lower plate of the capacitor, the total capacitance of the antifuse in its unprogrammed state may be substantially reduced.

Figure 9A:
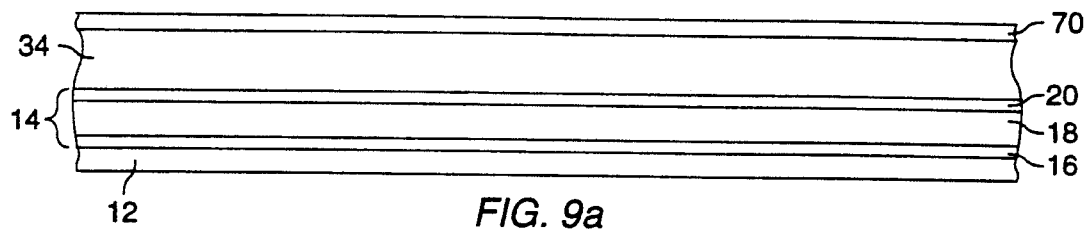
FIGS. 9a–9g are cross sectional views of a portion of a semiconductor device showing progressive steps in the formation of antifuse and metal to metal contacts according to an eighth embodiment of the present invention.

A final embodiment of the present invention comprises a variation of the process depicted in FIGS. 8a–8g and is disclosed with reference to FIGS. 9a–9g. Referring first to FIG. 9a, a first level metal interconnect layer 14 is formed over an underlying insulating layer 12. The first level metal interconnect layer is covered by a layer 34 of antifuse material. Antifuse layer 34 is covered by a barrier/capping layer 70.

Figure 9B:
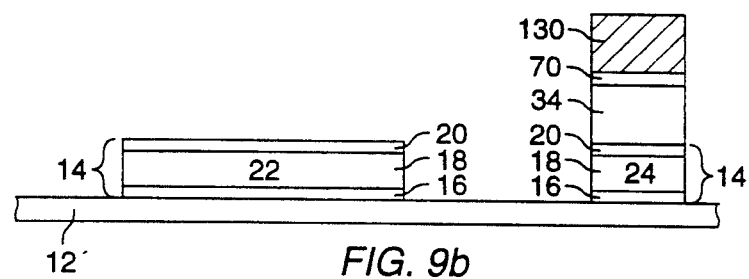

A metal-defining masking layer (not shown) is placed over the top of barrier/capping layer 70 and the underlying structure is patterned. Those of ordinary skill in the art will recognize that, as in the previously disclosed embodiments, this metal-defining masking layer is already employed in the conventional metallization process to pattern the first level metal interconnect layer 14. In FIG. 9b, first and second portions 22 and 24 of the first level metal interconnect layer 14 are shown after the metal-defining masking layer has been removed and illustrate the formation of an inter-metal contact and an antifuse structure. The masking layer is then removed.

Referring now to FIG. 9b, a masking layer 130 is placed over second portion 24 of the first level metal interconnect layer 14, and the barrier/capping layer 70 and antifuse layer 34 are removed from the top of first portion 22 of the first level metal interconnect layer 14. FIG. 9b shows the structure resulting after the performance of the etching step and prior to removal of the masking layer 130.

Figure 9C:
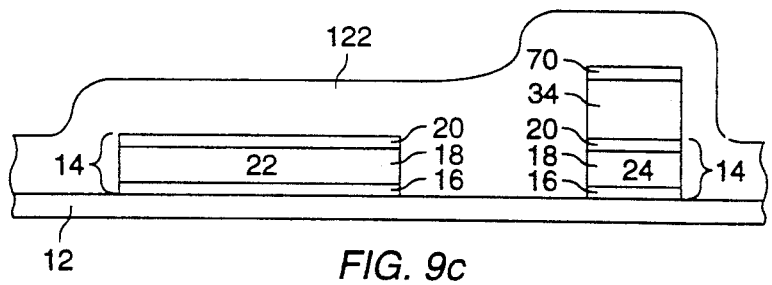

Referring now to FIG. 9c, the masking layer 130 is removed and a conformal dielectric layer 122 is placed over the surface of the structure. Conformal dielectric layer 122 may be formed from materials such as silicon nitride or silicon dioxide using fabrication techniques well known in the art.

Figure 9D:
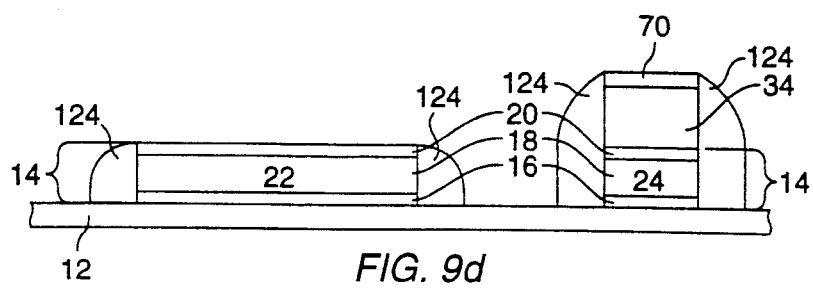

Referring now to FIG. 9d, an etching step is performed, leaving sidewall spacers 124 on the structure comprising second portion 24 of the first level metal interconnect layer 14 covered by antifuse material 34 and barrier/capping layer 70. FIG. 9d shows the structure resulting after formation of sidewall spacers 124.

Figure 9E:
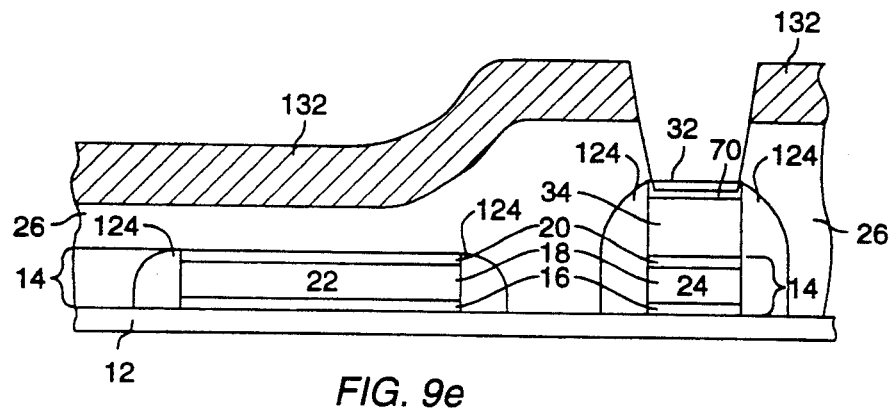

Referring now to FIG. 9e, an inter-metal dielectric layer 26 is then formed over the surface of the structure, and an antifuse defining masking layer 132 is placed over the surface of the structure to define antifuse cell opening 32. FIG. 9e shows the structure resulting after antifuse cell opening 32 has been etched through inter-metal dielectric layer 26 but prior to removal of antifuse defining masking layer 132.

Figure 9F:
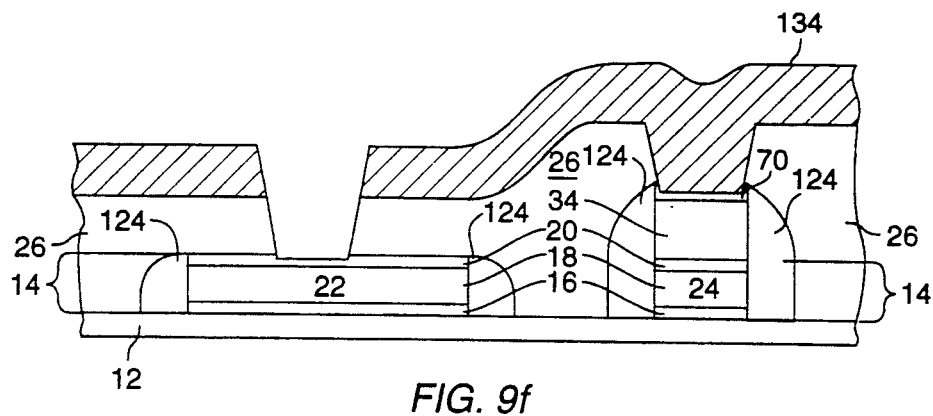

Referring now to FIG. 9f, a via hole masking layer 134 is placed over the surface of the structure to define via hole 30. FIG. 9e shows the structure resulting after via hole 30 has been etched through inter-metal dielectric layer 26 but prior to removal of via hole masking layer 134. FIG. 9f shows the structure resulting after via hole 30 has been formed but prior to removal of via hole masking layer 134.

Figure 9G:
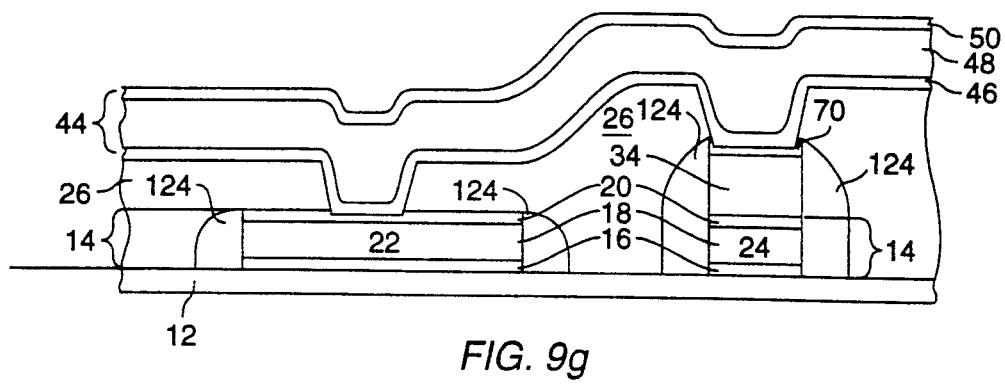

Referring now to FIG. 9g, via hole masking layer 134 is removed and a second level metal interconnect layer 44, which may include multiple layers as indicated by reference numerals 46, 48, and 50, is formed over the inter-metal dielectric layer 26 and in contact with the top of the first portion 2 of the first level metal interconnect layer 14 and the barrier/capping layer 70 in the antifuse cell opening 32.

Those of ordinary skill in the art will recognize that the embodiment of FIGS. 9a–9g provides the same high density and low capacitance advantages as the embodiment of FIGS. 8a–8e. In addition, the embodiment described with reference to FIGS. 9a–9g has an advantage over the embodiment of FIGS. 8a–8g in that the surface of the first portion 22 of the first level metal interconnect layer 14 is exposed to etching only once.

The embodiments of the invention disclosed herein enable one or more antifuses to be fabricated between the metal layers which serve as the interconnect layers of the circuit during the normal metallization portion of a double-metal CMOS process.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a microcircuit fabrication process, a process for simultaneously fabricating one or more antifuses and two metal interconnect layers interconnected with inter-metal vias, including the steps of:

forming and defining a first metal interconnect layer to comprise interconnect portions and antifuse portions;

forming an antifuse material layer over said first metal interconnect layer;

forming a barrier/capping layer;

defining said antifuse material layer and barrier/capping layers over said antifuse portions;

forming an inter-metal dielectric layer;

simultaneously forming antifuse cell openings and via holes at selected locations in said inter-metal dielectric layer, said via holes formed over said interconnect portions and said antifuse cell openings formed over said antifuse portions;

forming a second metal interconnect layer over said antifuse cell openings and said via holes; and defining said second metal interconnect layer.

2. In a microcircuit fabrication process, a process for simultaneously fabricating one or more antifuses and two metal interconnect layers interconnected with inter-metal vias, including the steps of:

forming and defining a first metal interconnect layer;

forming an inter-metal dielectric layer;

simultaneously forming via holes and antifuse cell openings at selected locations in said inter-metal dielectric layer, said via holes formed in said interconnect portions and said antifuse cell openings formed said antifuse portions;

forming an antifuse material layer covered by a barrier/capping layer in each of said antifuse cell openings;

defining said antifuse layer and barrier/capping layer;

forming a second metal interconnect layer over said antifuse cell openings and said via holes; and defining said second metal interconnect layer.

3. In a microcircuit fabrication process, a process for simultaneously fabricating one or more antifuses and two metal interconnect layers interconnected with inter-metal vias, including the steps of:

forming and defining a first metal interconnect layer;

forming an inter-metal dielectric layer;

forming antifuse cell openings at selected locations in said inter-metal dielectric layer in said antifuse portions;
forming an antifuse material layer covered by a barrier/capping layer in each of said antifuse cell openings;
defining said antifuse and barrier/capping layers;
forming via holes at selected locations in said interconnect portions;
forming a second metal interconnect layer over said antifuse cell openings and said via holes; and
defining said second metal interconnect layer.

4. In a microcircuit fabrication process, a process for simultaneously fabricating one or more antifuses and two metal interconnect layers interconnected with inter-metal vias, including the steps of:
forming a first metal interconnect layer;
forming an antifuse material layer over said first metal interconnect layer;
forming a barrier/capping layer over said antifuse material layer;
defining said first metal interconnect layer, said antifuse material layer and said barrier/capping layer into interconnect portions and antifuse portions;
removing said antifuse material layer and said barrier/ capping layer from said interconnect portions;
forming an inter-metal dielectric layer;
simultaneously forming via holes and antifuse cell openings at selected locations in said inter-metal dielectric layer, said via holes formed in said interconnect portions and said antifuse cell openings formed said antifuse portions;
forming a second metal interconnect layer over said antifuse cell openings and said via holes; and
defining said second metal interconnect layer.

5. In a microcircuit fabrication process, a process for simultaneously fabricating one or more antifuses and two metal interconnect layers interconnected with inter-metal vias, including the steps of:
forming a first metal interconnect layer;
forming an antifuse material layer over said first metal interconnect layer;
forming a barrier/capping layer over said antifuse material layer;
defining said first metal interconnect layer, said antifuse material layer and said barrier/capping layer into interconnect portions and antifuse portions;
forming an inter-metal dielectric layer;
forming antifuse cell openings at selected locations in said inter-metal dielectric layer, said antifuse cell openings formed said antifuse portions;
forming via holes at selected locations in said inter-metal dielectric layer, said via holes formed in said interconnect portions through said barrier/capping layer and said antifuse material layer;
forming a second metal interconnect layer over said antifuse cell openings and said via holes; and
defining said second metal interconnect layer.

6. In a microcircuit fabrication process, a process for simultaneously fabricating one or more antifuses and two metal interconnect layers interconnected with inter-metal vias, including the steps of:
forming a first metal interconnect layer;
forming an antifuse material layer over said first metal interconnect layer;
forming a barrier/capping layer over said antifuse material layer;
defining said first metal interconnect layer, said antifuse material layer and said barrier/capping layer into interconnect portions and antifuse portions;
removing said antifuse material layer and said barrier/ capping layer from said interconnect portions;
forming a conformal dielectric layer over said antifuse portions and said interconnect portions;
etching said conformal dielectric layer to leave sidewall spacers around said antifuse portions and said interconnect portions;
forming an inter-metal dielectric layer;
simultaneously forming via holes and antifuse cell openings at selected locations in said inter-metal dielectric layer, said via holes formed in said interconnect portions and said antifuse cell openings formed said antifuse portions;
forming a second metal interconnect layer over said antifuse cell openings and said via holes; and
defining said second metal interconnect layer.

7. In a microcircuit fabrication process, a process for simultaneously fabricating one or more antifuses and two metal interconnect layers interconnected with inter-metal vias, including the steps of:
forming a first metal interconnect layer;
forming an antifuse material layer over said first metal interconnect layer;
forming a barrier/capping layer over said antifuse material layer;
defining said first metal interconnect layer, said antifuse material layer and said barrier/capping layer into interconnect portions and antifuse portions;
forming a conformal dielectric layer over said antifuse portions and said interconnect portions;
etching said conformal dielectric layer to leave sidewall spacers around said antifuse portions and said interconnect portions;
forming an inter-metal dielectric layer;
forming antifuse cell openings at selected locations in said inter-metal dielectric layer, said antifuse cell openings formed said antifuse portions;
forming via holes at selected locations in said inter-metal dielectric layer, said via holes formed in said interconnect portions through said barrier/capping layer and said antifuse material layer;
forming a second metal interconnect layer over said antifuse cell openings and said via holes; and
defining said second metal interconnect layer.

* * * * *